US011502115B2

(12) United States Patent
Suzuki et al.

(10) Patent No.: US 11,502,115 B2
(45) Date of Patent: Nov. 15, 2022

(54) ACTIVE MATRIX SUBSTRATE AND METHOD FOR MANUFACTURING SAME

(71) Applicant: SHARP KABUSHIKI KAISHA, Sakai (JP)

(72) Inventors: Masahiko Suzuki, Sakai (JP); Tetsuo Kikuchi, Sakai (JP); Setsuji Nishimiya, Sakai (JP); Kengo Hara, Sakai (JP); Hitoshi Takahata, Sakai (JP); Tohru Daitoh, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 100 days.

(21) Appl. No.: 17/230,041

(22) Filed: Apr. 14, 2021

(65) Prior Publication Data

US 2021/0327923 A1   Oct. 21, 2021

Related U.S. Application Data

(60) Provisional application No. 63/013,194, filed on Apr. 21, 2020.

(51) Int. Cl.
| | |
|---|---|
| *H01L 21/02* | (2006.01) |
| *H01L 27/12* | (2006.01) |
| *H01L 29/24* | (2006.01) |
| *H01L 29/786* | (2006.01) |
| *H01L 29/66* | (2006.01) |

(Continued)

(52) U.S. Cl.
CPC .... *H01L 27/1244* (2013.01); *H01L 21/02565* (2013.01); *H01L 21/02631* (2013.01);
(Continued)

(58) Field of Classification Search
CPC ......... H01L 21/02565; H01L 21/02631; H01L 21/8234; H01L 21/823412; H01L 27/127;
(Continued)

(56) References Cited

U.S. PATENT DOCUMENTS

| | | |
|---|---|---|
| 2007/0001172 A1 | 1/2007 | Yu et al. |
| 2008/0035920 A1 | 2/2008 | Takechi et al. |

(Continued)

FOREIGN PATENT DOCUMENTS

| | | |
|---|---|---|
| JP | 2007-013084 A | 1/2007 |
| JP | 2008-040343 A | 2/2008 |

(Continued)

OTHER PUBLICATIONS

Co-Pending letter regarding a related co-pending U.S. Appl. No. 17/156,769, filed Jan. 25, 2021.

*Primary Examiner* — Nikolay K Yushin
(74) *Attorney, Agent, or Firm* — ScienBiziP, P.C.

(57) ABSTRACT

An active matrix substrate includes a substrate, a first gate bus line, a second gate bus line, a third gate bus line, a first source bus line, a second source bus line, a first pixel region, a second pixel region, and a first source contact portion. When viewed from a normal direction of the substrate, a first opening portion is located between the second gate bus line and the third gate bus line, and a first distance D1 in a column direction between the second gate bus line and the first opening portion and a second distance D2 in the column direction between the third gate bus line and the first opening portion are both ⅕ or more of a second interval Dy2 in the column direction between the second gate bus line and the third gate bus line.

14 Claims, 22 Drawing Sheets

(51) Int. Cl.
  *G02F 1/1368*  (2006.01)
  *G02F 1/1362*  (2006.01)
(52) U.S. Cl.
  CPC ........ *H01L 27/127* (2013.01); *H01L 27/1225* (2013.01); *H01L 29/24* (2013.01); *H01L 29/66969* (2013.01); *H01L 29/7869* (2013.01); *G02F 1/1368* (2013.01); *G02F 1/136286* (2013.01)
(58) Field of Classification Search
  CPC . H01L 27/1244; H01L 29/7869; H01L 29/24; H01L 29/66969; H01L 29/78633; H01L 29/78696; G02F 1/136286; G02F 1/1368; G02F 1/13685
  See application file for complete search history.

(56) References Cited

U.S. PATENT DOCUMENTS

| | | |
|---|---|---|
| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |
| 2017/0090229 A1 | 3/2017 | Imai et al. |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| JP | 2015-109315 A | 6/2015 |
| WO | 2015/186619 A1 | 12/2015 |

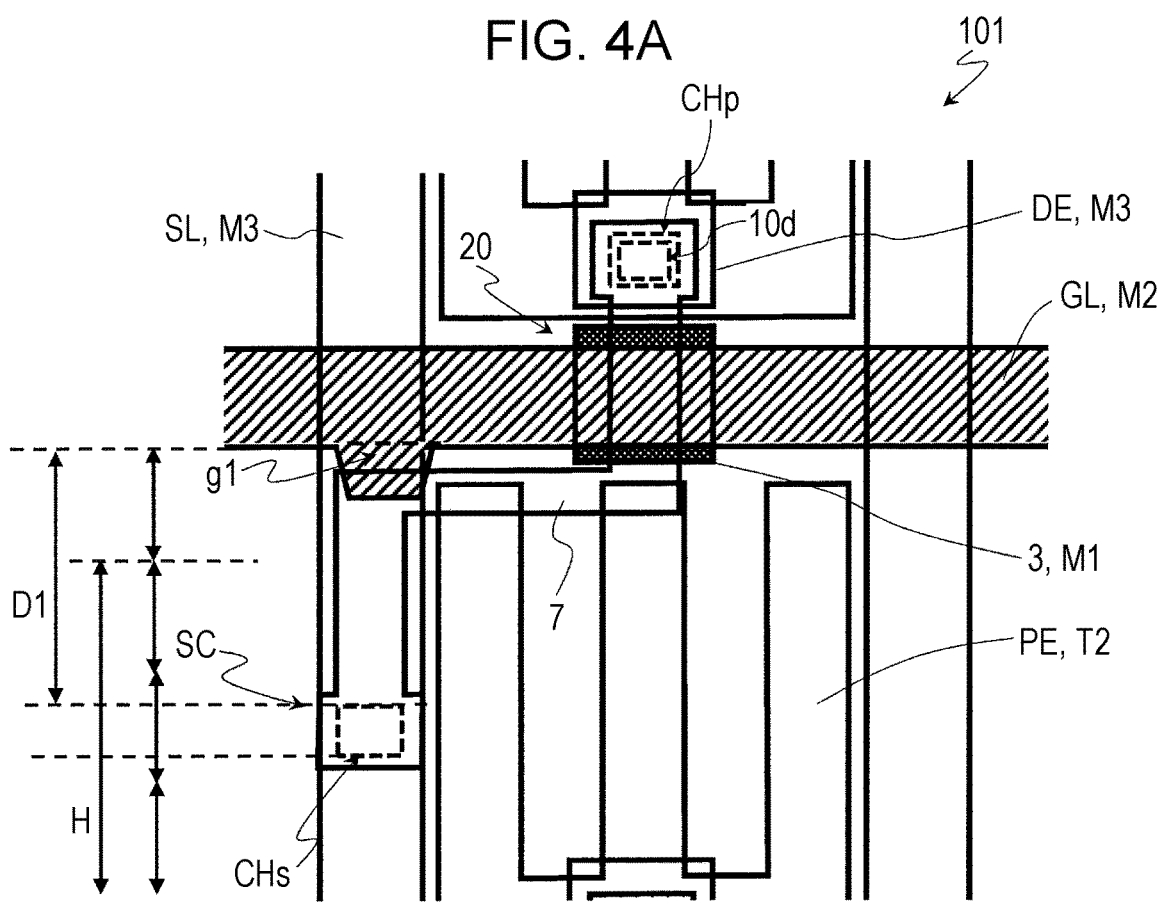
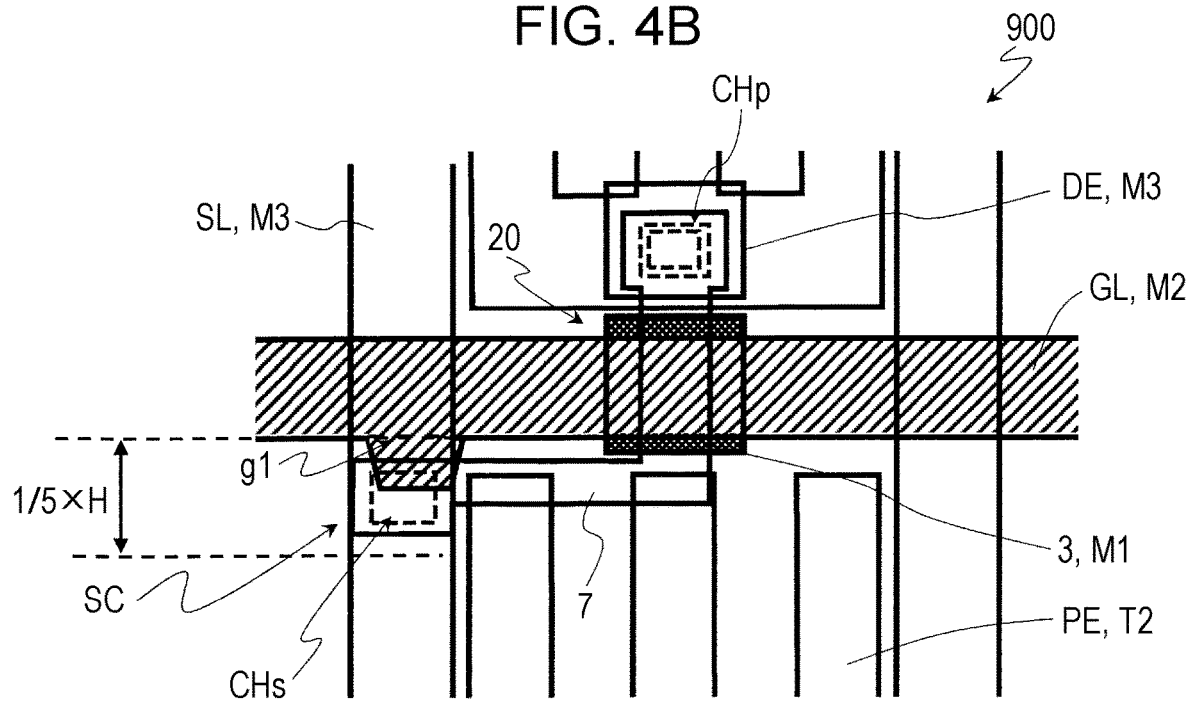

ACTIVE MATRIX SUBSTRATE AND METHOD FOR MANUFACTURING SAME

BACKGROUND

1. Field

The present disclosure relates to active matrix substrate and a method for manufacturing the same.

2. Description of the Related Art

A display device including an active matrix substrate provided with a switching element for each pixel is widely used. An active matrix substrate including a thin film transistor (hereinafter, referred to as a "TFT") as a switching element is referred to as a TFT substrate. In the present specification, a portion of the TFT substrate corresponding to a pixel of the display device is referred to as a pixel region or a pixel. A TFT provided as the switching element in each pixel of the TFT substrate is referred to as a "pixel TFT". A plurality of source bus lines and a plurality of gate bus lines are provided on the TFT substrate, and pixel TFTs are disposed near intersection portions of these. A source electrode of the pixel TFT is connected to one of the source bus lines, and a gate electrode is connected to one of the gate bus lines.

In recent years, it has been proposed to use an oxide semiconductor instead of amorphous silicon or polycrystalline silicon as a material for an active layer of the TFT. Such a TFT is referred to as an "oxide semiconductor TFT". The oxide semiconductor has higher mobility than amorphous silicon. Therefore, the oxide semiconductor TFT can operate at higher speed than an amorphous silicon TFT. Since an oxide semiconductor film is formed by a simpler process than a polycrystalline silicon film, the oxide semiconductor film can be applied to an apparatus which requires a large area.

Most oxide semiconductor TFTs are bottom gate type TFTs, and a top gate type oxide semiconductor TFT has also been proposed (for example, Japanese Unexamined Patent Application Publication No. 2015-109315 and International Publication No. 2015/186619).

Japanese Unexamined Patent Application Publication No. 2015-109315 discloses a top gate type TFT in which a gate electrode is disposed on a portion of an oxide semiconductor layer via a gate insulating layer, and source and drain electrodes are disposed on an insulating layer which covers the gate electrode.

On the other hand, International Publication No. 2015/186619 by the present applicant proposes a substrate structure (hereinafter, "lower source substrate structure") in which a source bus line is provided closer to a substrate side than a gate bus line. In this structure, the source bus line is disposed closer to the substrate side than the oxide semiconductor layer of the oxide semiconductor TFT, and the gate bus line is disposed above the oxide semiconductor layer. According to the TFT substrate having the lower source substrate structure (hereinafter, abbreviated as a "lower source substrate"), since an insulating layer located between the source bus line and the gate bus line can be thickened, it is possible to reduce the parasitic capacitance generated at an intersection portion of these bus lines.

In a TFT substrate using a top gate type pixel TFT, the oxide semiconductor layer of the pixel TFT and the corresponding source bus line are electrically connected to each other in, for example, a source contact hole provided in an insulating layer located between them. The source contact hole is usually disposed in the vicinity of the gate bus line in order to suppress a decrease in the pixel aperture ratio.

As a result of a study by the present inventor, it has been found that in the above-mentioned TFT substrate, when a poor pattern of the gate bus line occurs, a portion of the gate bus line may extend to the inside of the source contact hole and be electrically connected to the source bus line (or source electrode). As a result, there is a concern that a leak between the gate and the source may occur in the pixel TFT.

An embodiment of the present disclosure provides an active matrix substrate including an oxide semiconductor TFT as a pixel TFT and capable of suppressing leakage defects between a gate and a source of the oxide semiconductor TFT.

The present specification discloses an active matrix substrate and a method for manufacturing the active matrix substrate described in the following items.

SUMMARY

According to an aspect of the disclosure, there is provided an active matrix substrate that includes a plurality of pixel regions disposed in a matrix in a row direction and a column direction, the active matrix substrate including: a substrate; a plurality of gate bus lines supported on a main surface of the substrate and extending in the row direction; a plurality of source bus lines supported on the main surface of the substrate and extending in the column direction; an interlayer insulating layer that covers the plurality of gate bus lines; a plurality of oxide semiconductor TFTs disposed in association with the plurality of pixel regions; and a plurality of pixel electrodes disposed in each of the plurality of pixel regions, in which the plurality of gate bus lines include a first gate bus line, a second gate bus line, and a third gate bus line disposed adjacent to each other in this order, and the plurality of source bus lines include a first source bus line and a second source bus line disposed adjacent to each other, the plurality of pixel regions include a first pixel region defined by the first gate bus line, the second gate bus line, the first source bus line, and the second source bus line, and a second pixel region defined by the second gate bus line, the third gate bus line, the first source bus line, and the second source bus line, the plurality of oxide semiconductor TFTs include a first TFT associated with the first pixel region, the first TFT including: an oxide semiconductor layer including a channel region, and a first region and a second region located on both sides of the channel region, respectively, at least a portion of the first region being located in the second pixel region, at least a portion of the second region being located in the first pixel region; a gate electrode disposed on the channel region of the oxide semiconductor layer via a gate insulating layer, the gate electrode being connected to the second gate bus line or being a portion of the second gate bus line; and a source electrode disposed on the interlayer insulating layer, the active matrix substrate further includes: a first pixel contact portion that electrically connects the second region in the first TFT to a first pixel electrode disposed in the first pixel region of the plurality of pixel electrodes; and a first source contact portion that electrically connects the first region in the first TFT to the first source bus line via the source electrode, in the first source contact portion, the interlayer insulating layer has a first opening portion that exposes a portion of the first region, and the source electrode is electrically connected to the first region within the first opening portion, and when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both ⅕ or more of a second interval Dy2 in the column direction between the second gate bus line and the third gate bus line.

According to an aspect of the disclosure, there is provided a method for manufacturing an active matrix substrate that includes a plurality of pixel regions, a plurality of source bus lines extending in a column direction and including a first source bus line and a second source bus line disposed adjacent to each other, a plurality of gate bus lines extending in a row direction and including a first gate bus line, a second gate bus line, and a third gate bus line disposed adjacent to each other in this order, and a plurality of oxide semiconductor TFTs associated with the plurality of pixel regions, the plurality of pixel regions including a first pixel region defined by the first gate bus line, the second gate bus line, the first source bus line, and the second source bus line, and a second pixel region defined by the second gate bus line, the third gate bus line, the first source bus line, and the second source bus line, the plurality of oxide semiconductor TFTs including a first TFT associated with the first pixel region, the method including: in a first TFT forming region where the first TFT is formed, (a) forming an oxide semiconductor layer of the first TFT on a substrate; (b) forming a gate insulating layer from a gate insulating film and integrally forming a gate electrode of the first TFT and the second gate bus line from a gate conductive film by forming the gate insulating film and the gate conductive film so as to cover the oxide semiconductor layer, and patterning the gate insulating film and the gate conductive film; (c) forming an interlayer insulating layer covering the gate electrode and the second gate bus line; (d) forming a first opening portion that exposes a portion of the oxide semiconductor layer of the first TFT in the interlayer insulating layer; and (e) integrally forming a source electrode of the first TFT and the first source bus line by forming a source conductive film on the interlayer insulating layer and in the first opening portion, and patterning the source conductive film, the source electrode being in contact with the portion of the oxide semiconductor layer in the first opening portion, in which, when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both ⅕ or more of a second interval Dy2 in the column direction between the second gate bus line and the third gate bus line.

According to an aspect of the disclosure, there is provided a method for manufacturing an active matrix substrate that includes a plurality of pixel regions, a plurality of source bus lines extending in a column direction and including a first source bus line and a second source bus line disposed adjacent to each other, a plurality of gate bus lines extending in a row direction and including a first gate bus line, a second gate bus line, and a third gate bus line disposed adjacent to each other in this order, and a plurality of oxide semiconductor TFTs associated with the plurality of pixel regions, the plurality of pixel regions including a first pixel region defined by the first gate bus line, the second gate bus line, the first source bus line, and the second source bus line, and a second pixel region defined by the second gate bus line, the third gate bus line, the first source bus line, and the second source bus line, the plurality of oxide semiconductor TFTs including a first TFT associated with the first pixel region, the method including: in a first TFT forming region where the first TFT is formed, (a) forming the first source bus line by forming a lower conductive film on a substrate and patterning the lower conductive film; (b) forming a lower insulating layer covering the first source bus line; (c) forming an oxide semiconductor layer of the first TFT on the lower insulating layer; (d) forming a gate insulating layer from a gate insulating film and integrally forming a gate electrode of the first TFT and the second gate bus line from a gate conductive film by forming the gate insulating film and the gate conductive film so as to cover the oxide semiconductor layer, and patterning the gate insulating film and the gate conductive film; (e) forming an interlayer insulating layer covering the gate electrode and the second gate bus line; (f) forming a first source contact hole that exposes a portion of the first source bus line of the first TFT and a portion of the oxide semiconductor layer by patterning the interlayer insulating layer and the lower insulating layer, the first source contact hole including a first opening portion formed in the interlayer insulating layer and a lower opening portion formed in the lower insulating layer; and (g) forming a source electrode in contact with the portion of the first source bus line and the portion of the oxide semiconductor layer in the first source contact hole by forming a source conductive film on the interlayer insulating layer and in the first source contact hole, and patterning the source conductive film, in which, when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both ⅕ or more of a second interval Dy2 in the column direction between the second gate bus line and the third gate bus line.

BRIEF DESCRIPTION OF THE DRAWINGS

FIG. 4A is a plan view illustrating a case where a pattern collapse of a gate bus line GL occurs in the active matrix substrate 101;

FIG. 4B is a plan view illustrating a case where a pattern collapse of a gate bus line GL occurs in an active matrix substrate 900 according to a comparative example;

DESCRIPTION OF THE EMBODIMENTS

First Embodiment

Hereinafter, an active matrix substrate according to a first embodiment will be described with reference to the drawings.

Basic Structure of Active Matrix Substrate 101

Figure 1:
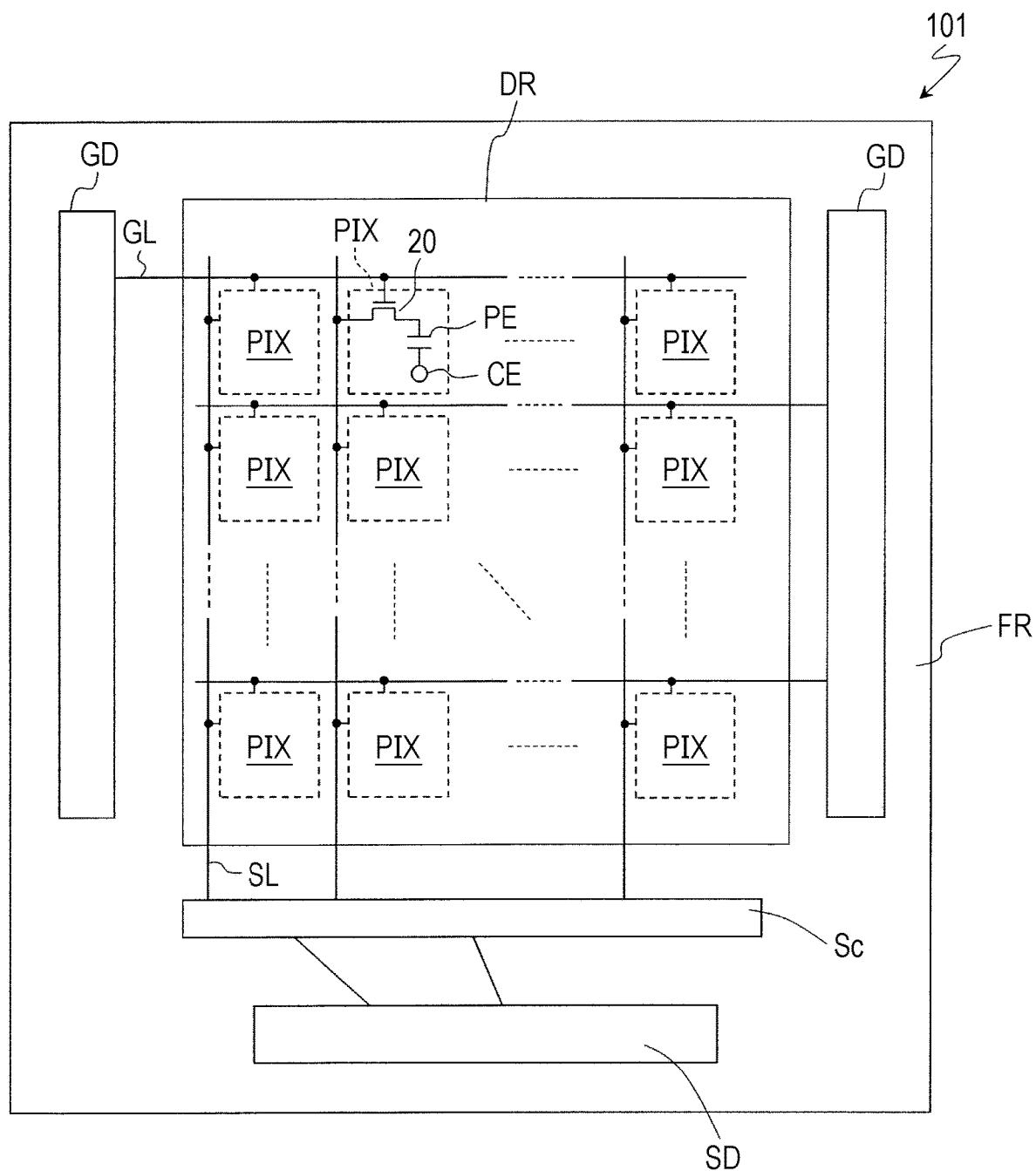
FIG. 1 is a schematic diagram illustrating an example of a planar structure of an active matrix substrate 101.

FIG. 1 is a plan view schematically illustrating an example of an active matrix substrate 101. The active matrix substrate 101 includes a display region DR contributing to display and a peripheral region (frame region) FR located outside the display region DR. The display region DR includes a plurality of pixel regions PIX arranged in a matrix. The pixel region PIX (sometimes referred to simply as a "pixel") is a region corresponding to a pixel of a display device. The non-display region FR is a region located around the display region DR and does not contribute to display.

In the display region DR, the active matrix substrate 101 is provided with a substrate 1, a plurality of pixel TFTs (hereinafter, simply TFT) 20 supported by the substrate 1, a plurality of pixel electrodes PE, a plurality of gate bus lines GL for supplying a gate signal to the TFT 20, and a plurality of source bus lines SL for supplying a source signal to the TFT 20. The TFT 20 is an oxide semiconductor TFT having an oxide semiconductor layer as an active layer.

Each pixel region PIX is defined by, for example, the gate bus line GL and the source bus line SL. The source bus line SL extends in a direction intersecting with the gate bus line GL.

Each of the TFTs 20 and each of the pixel electrodes PE are provided corresponding to one of the plurality of pixel regions PIX. A gate electrode of the TFT 20 is electrically connected to one of the gate bus lines GL. A portion of the oxide semiconductor layer of the TFT 20 (referred to as a "first region") is electrically connected to one of the source bus lines SL. The other portion of the oxide semiconductor layer (referred to as a "second region") of the TFT 20 is electrically connected to the pixel electrode PE.

In a case where the active matrix substrate 101 is applied to a display device in a lateral electric field mode such as a fringe field switching (FFS) mode, the active matrix substrate 101 is provided with a common electrode CE for the plurality of pixels PIX.

In the non-display region FR, a peripheral circuit such as a driver can be provided. In this example, a gate driver GD driving the gate bus line GL, an SSD circuit Sc driving the source bus line SL in a time division manner, and the like are monolithically formed. The SSD circuit Sc is connected to a source driver SD mounted by, for example, a chip on glass (COG) method.

Structure of Pixel Region of Active Matrix Substrate 101

Hereinafter, a structure of the pixel region of the active matrix substrate according to the present embodiment will be described using an active matrix substrate applied to an FFS mode display device as an example with reference to the drawings. The FFS mode is a lateral electric field mode in which a pair of electrodes is provided on one substrate and an electric field is applied to liquid crystal molecules in a direction parallel to a substrate surface (lateral direction).

In the following description, a layer including electrodes, wiring, and the like, which is disposed on the substrate side of the oxide semiconductor layer serving as the active layer of the pixel TFT and is formed of a first conductive film (also referred to as a lower conductive film) is referred to as a "first metal layer M1". The first metal layer M1 includes, for example, a light shielding layer of a pixel TFT. Further, a layer including electrodes, wiring, and the like, which is disposed on the oxide semiconductor layer via a gate insulating layer and is formed of a second conductive film (also referred to as a gate conductive film) is referred to as a "second metal layer M2". The second metal layer M2 includes a plurality of gate bus lines GL and a gate electrode of each pixel TFT. Further, a layer including electrodes, wiring, and the like, which is disposed on the second metal layer M2 via an interlayer insulating layer and is formed of a third conductive film (also referred to as a source conductive film) is referred to as a "third metal layer M3". The third metal layer M3 includes a plurality of source bus lines SL and a source electrode of each pixel TFT. As will be described later, the source bus line SL may be formed on the first metal layer M1.

In the drawings, after the reference numeral of each component, the layer in which the electrode or wiring is formed may be illustrated in parentheses. For example, the electrode or wiring formed in the first metal layer M1 may be labeled with "(M1)" after the reference numeral thereof.

Figure 2A:
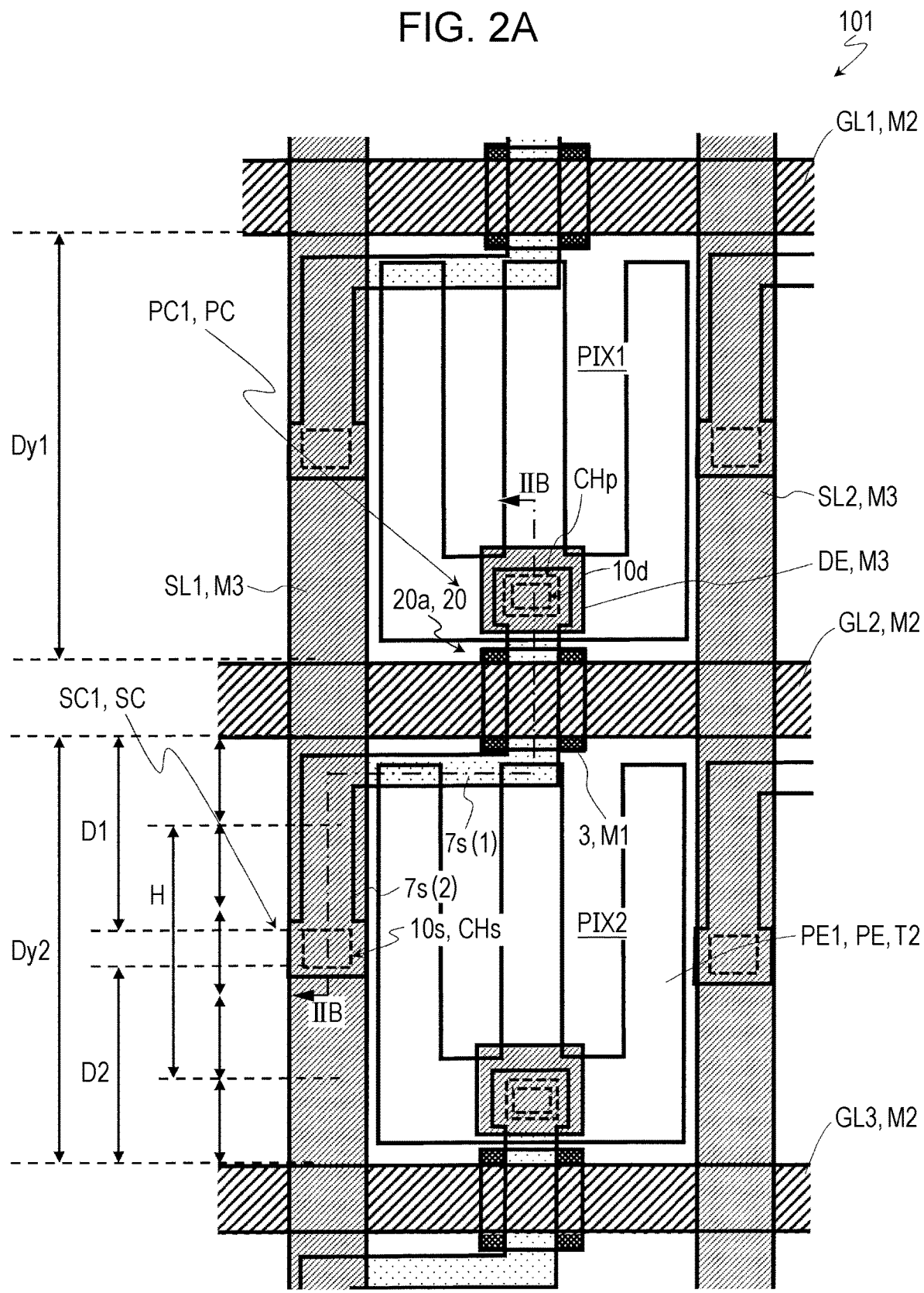
FIG. 2A is a plan view illustrating a pixel region in the active matrix substrate 101 according to a first embodiment.
Figure 2B:
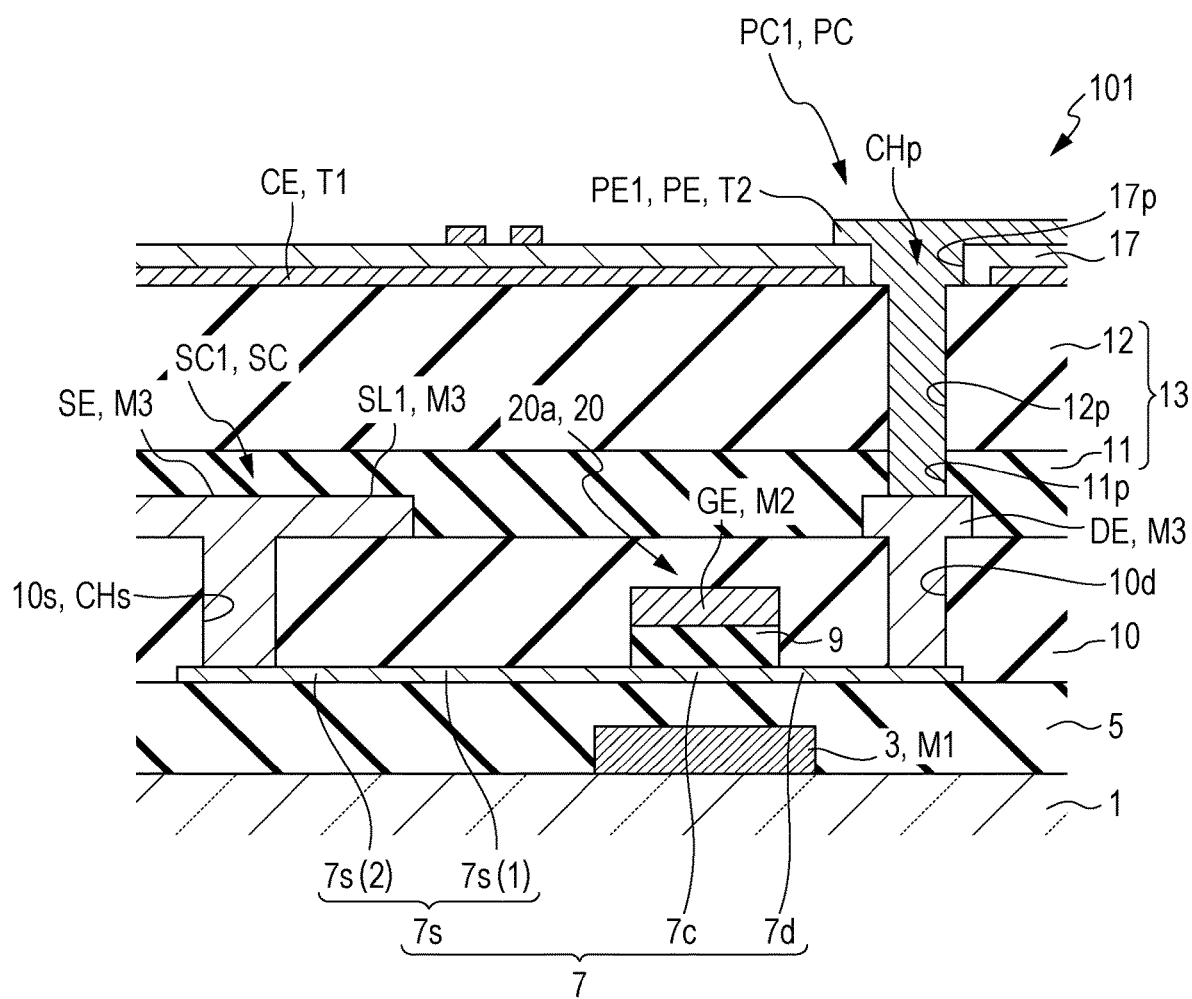
FIG. 2B is a cross-sectional view of the active matrix substrate 101 taken along the line IIB-IIB illustrated in FIG. 2A.

FIG. 2A is a plan view illustrating a pixel region in the active matrix substrate 101. Although the active matrix substrate 101 has a large number of pixel regions, FIG. 2A illustrates only two pixel regions adjacent to each other in the column direction. FIG. 2B is a cross-sectional view taken along the line IIB-IIB illustrated in FIG. 2A, which illustrates a cross-section of the TFT 20 in a channel length direction.

The active matrix substrate 101 includes a substrate 1 having a main surface, a first metal layer M1 disposed on the main surface of the substrate 1, a lower insulating layer 5 covering the first metal layer M1, a second metal layer M2 including the plurality of gate bus lines GL extending in the row direction, an interlayer insulating layer 10 covering the second metal layer M2, a third metal layer M3 disposed on the interlayer insulating layer 10 and including the plurality of source bus lines SL extending in the column direction, and an upper insulating layer 13 covering the third metal layer M3.

FIG. 2A illustrates a first gate bus line GL1, a second gate bus line GL2, and a third gate bus line GL3 disposed adjacent to each other in this order among the plurality of gate bus lines GL, and illustrates a first source bus line SL1 and a second source bus line SL2 disposed adjacent to each other among the plurality of source bus lines SL. A pixel region defined by the first gate bus line GL1, the second gate bus line GL2, the first source bus line SL1, and the second source bus line SL2 is referred to as a "first pixel region PIX1", and a pixel region defined by the second gate bus line GL2, the third gate bus line GL3, the first source bus line SL1, and the second source bus line SL2 is referred to as a "second pixel region PIX2". When viewed from a normal direction of the substrate 1, the first pixel region PIX1 and the second pixel region PIX2 are adjacent to each other in the column direction with the second gate bus line GL2 interposed therebetween.

The active matrix substrate 101 also includes a plurality of top gate type TFTs 20, and a plurality of pixel electrodes PE. Each of the TFT 20 and the pixel electrode PE is provided corresponding to each of the plurality of pixel regions PIX. In the present specification, among the TFT 20 and the pixel electrode PE, a TFT and a pixel electrode associated with the first pixel region PIX1 may be referred to as a "first TFT 20a" and a "first pixel electrode PE1", respectively. The active matrix substrate 101 may further include a common electrode CE.

Each TFT 20 is provided with an oxide semiconductor layer 7 disposed on the lower insulating layer 5, a gate electrode GE disposed on a portion of the oxide semiconductor layer 7 via a gate insulating layer 9, a source electrode SE, and a drain electrode DE.

The oxide semiconductor layer 7 includes a channel region 7c, and a first region 7s and a second region 7d disposed on both sides thereof, respectively. The first region 7s and the second region 7d are low resistance regions having a lower specific resistance than that of the channel region 7c. The first region 7s is electrically connected to the source electrode SE, and the second region 7d is electrically connected to the drain electrode DE.

The gate electrode GE is disposed so as to overlap the channel region 7c when viewed from the normal direction of the main surface of the substrate 1 (hereinafter, abbreviated as the "normal direction of the substrate 1"). The gate electrode GE is formed using the same conductive film as that of the gate bus line GL (that is, in the second metal layer M2). The gate electrode GE is electrically connected to the corresponding gate bus line GL. For example, the gate electrode GE of the first TFT 20a is electrically connected to the second gate bus line GL2. The gate electrode GE may be integrally formed with the corresponding gate bus line GL. For example, the gate electrode GE may be connected to the corresponding gate bus line GL or a portion of the corresponding gate bus line GL. In such a case, a portion of the gate bus line GL overlapping the oxide semiconductor layer 7 when viewed from the normal direction of the substrate 1 is referred to as a "gate electrode GE".

The gate insulating layer 9 may cover the channel region 7c and may not cover the first region 7s and the second region 7d. In the illustrated example, the gate insulating layer 9 is formed only in a region overlapping the second metal layer M2 when viewed from the normal direction of the substrate 1. That is, an edge of the gate insulating layer 9 is aligned with an edge of the second metal layer M2.

The interlayer insulating layer 10 is formed so as to cover the oxide semiconductor layer 7, the gate insulating layer 9, and the second metal layer M2. The interlayer insulating layer 10 may be in contact with the first region 7s and the second region 7d of the oxide semiconductor layer 7.

The source electrode SE and the drain electrode DE are disposed on the interlayer insulating layer 10. In this example, the source electrode SE and the drain electrode DE are formed using the same conductive film as the source bus line SL (that is, in the third metal layer M3). The source electrode SE is electrically connected to the corresponding source bus line SL. The drain electrode DE is electrically connected to the corresponding pixel electrode PE. For example, the source electrode SE and the drain electrode DE of the first TFT 20a are electrically connected to the first source bus line SL1 and the first pixel electrode PE1, respectively. The source electrode SE may be integrally formed with the corresponding source bus line SL. For example, the source electrode SE may be connected to the corresponding source bus line SL or a portion of the corresponding source bus line SL. In such a case, a portion of the source bus line SL located at a source contact portion SC is referred to as a "source electrode SE".

The interlayer insulating layer 10 is provided with a first opening portion 10s that exposes a portion of the first region 7s of the oxide semiconductor layer 7 and a second opening portion 10d that exposes a portion of the second region 7d. The source electrode SE is disposed on the interlayer insulating layer 10 and in the first opening portion 10s, and is connected to the first region 7s in the first opening portion 10s. The drain electrode DE is disposed on the interlayer insulating layer 10 and in the second opening portion 10d, and is connected to the second region 7d in the second opening portion 10d.

The TFT 20 may have a light shielding layer 3 on the substrate 1 side of the oxide semiconductor layer 7. The light shielding layer 3 is formed in the first metal layer M1. The light shielding layer 3 may be disposed so as to overlap at least the channel region 7c in the oxide semiconductor layer 7 when viewed from the normal direction of the substrate 1. As a result, deterioration of characteristics of the oxide semiconductor layer 7 due to light (backlight light) from the substrate 1 side can be suppressed.

The upper insulating layer 13 includes, for example, an inorganic insulating layer (passivation film) 11. As illustrated in the drawing, the upper insulating layer 13 may have a laminated structure including the inorganic insulating layer 11 and an organic insulating layer 12 formed on the inorganic insulating layer 11. The organic insulating layer 12 may not be formed. Alternatively, the organic insulating layer 12 may be formed only in the display region.

The pixel electrode PE and the common electrode CE are disposed so as to face each other with a dielectric layer 17 interposed therebetween. In this example, the common electrode CE is disposed on the upper insulating layer 13, and the pixel electrode PE is disposed on the common electrode CE via the dielectric layer 17. The pixel electrode PE may be disposed on the upper insulating layer 13, and the common electrode CE may be disposed on the pixel electrode PE via the dielectric layer 17. In the present specification, of the common electrode CE and the pixel electrode PE, an electrode located on the substrate 1 side is referred to as a "lower transparent electrode", and an electrode disposed on the lower transparent electrode via the dielectric layer 17 is referred to as an "upper transparent electrode". Further, a layer including the lower transparent electrode is referred to as a "lower transparent conductive layer T1", and a layer including the upper transparent electrode is referred to as an "upper transparent conductive layer T2". The upper transparent electrode (pixel electrode PE in this example) is provided with one or a plurality of slits (opening portions) or notched portions in each pixel region.

The pixel electrode PE is separated for each pixel region. The pixel electrode PE is electrically connected to the drain electrode DE of the corresponding TFT 20 in a pixel contact hole CHp. In the present embodiment, since the pixel electrode PE is disposed on the dielectric layer 17, the pixel contact hole CHp is formed in the upper insulating layer 13 and the dielectric layer 17. The pixel contact hole CHp includes an opening portion 1ip of the inorganic insulating layer 11, an opening portion 12p of the organic insulating layer 12, and an opening portion 17p of the dielectric layer 17.

The common electrode CE may not be separated for each pixel region PIX. For example, the common electrode CE may be formed over the entire pixel region except for the region where each pixel contact hole CHp is formed.

In the present specification, a connection portion SC that connects the first region 7s of the TFT 20 to the corresponding source bus line SL via the source electrode SE is referred to as a "source contact portion". The source contact portion SC includes a source contact hole CHs formed in an insulating layer including the interlayer insulating layer 10. In this example, the source contact hole CHs is the first opening portion 10s formed in the interlayer insulating layer 10. Further, a connection portion PC that connects the second region 7d of the TFT 20 to the corresponding pixel electrode PE is referred to as a "pixel contact portion". When the second region 7d and the pixel electrode PE are connected via the drain electrode DE, the pixel contact portion PC includes the pixel contact hole CHp for connecting the drain electrode DE and the pixel electrode PE, which is formed in an insulating layer including the upper insulating layer 13, and the second opening portion 10d for connecting the second region 7d of the TFT 20 and the drain electrode DE, which is formed in the interlayer insulating layer 10. In this example, the pixel contact hole CHp includes an opening portion 13p formed in the upper insulating layer 13 and an opening portion 17p formed in the dielectric layer 17. In the present specification, the source contact portion that connects the first TFT 20a and the first source bus line SL1 may be referred to as a "first source contact portion SC1", and the pixel contact portion that connects the first TFT 20a and the first pixel electrode may be referred to as a "first pixel contact portion PC1".

As will be described later, in the lower source substrate, the source contact hole CHs may include the first opening portion 10s and the lower opening portion formed in the lower insulating layer 5. When the drain electrode DE is not provided on each TFT 20, one pixel contact hole CHp that exposes a portion of the second region 7d may be formed in the insulating layer including the interlayer insulating layer 10 and the upper insulating layer 13. In this case, the pixel contact hole CHp includes, for example, a second opening portion 10d formed in the interlayer insulating layer 10 and an opening portion 13p formed in the upper insulating layer 13. When the pixel electrode PE is formed in the upper transparent conductive layer T2, the pixel contact hole CHp further includes an opening portion 17p formed in the dielectric layer 17.

Disposition of Pixel TFT 20, Source Contact Portion SC, and Pixel Contact Portion PC Next, taking the first TFT 20a, the first pixel electrode PE1, the first source contact portion SC1, and the first pixel contact portion PC 1 associated with the first pixel region PIX1 as an example, the specific disposition of the pixel TFT 20, the source contact portion SC, and the pixel contact portion PC will be described.

The oxide semiconductor layer 7 of the first TFT 20a extends across the corresponding gate bus line (here, the second gate bus line GL2). In this example, the portion of the oxide semiconductor layer 7 overlapping the second gate bus line GL2 via the gate insulating layer 9 is the channel region 7c. At least a portion of the first region 7s of the oxide semiconductor layer 7 is located in the second pixel region PIX2, and at least a portion of the second region 7d is located in the first pixel region PIX1.

The first pixel contact portion PC1 is disposed in, for example, the first pixel region PIX1. At least a portion of the first pixel contact portion PC1 may be disposed in a light transmitting region in the first pixel region PIX1. In this example, the second opening portion 10d and the pixel contact hole CHp formed in the interlayer insulating layer 10 are disposed so as to overlap at least partially when viewed from the normal direction of the substrate 1, but they may not overlap with each other.

The first source contact portion SC1 is disposed between the second gate bus line GL2 and the third gate bus line GL3. The first source contact portion SC1 electrically connects the first region 7s in the first TFT 20a to one corresponding source bus line (here, the first source bus line SL1) via the source electrode SE. In the first source contact portion SC1, the source electrode SE is electrically connected to the first region 7s of the first TFT20a in the source contact hole CHs. The source contact hole CHs includes the first opening portion 10s formed in the interlayer insulating layer 10.

When viewed from the normal direction of the substrate 1, the first opening portion 10s is arranged within the region H located substantially in the middle between the second gate bus line GL2 and the third gate bus line GL3. In the present specification, "region H" refers to a region that is located in the middle of the interval Dy between the two gate bus lines and has a length of ⅗ of Dy in the column direction. That is, when the distance D1 in the column direction between the second gate bus line GL2 and the first opening portion 10s is the "first distance", and the distance D2 in the column direction between the third gate bus line GL3 and the first opening portion 10s is the "second distance", the first distance D1 and the second distance D2 are both ⅕ or more of the second interval Dy2 in the column direction between the second gate bus line GL2 and the third gate bus line GL3.

Figure 3:
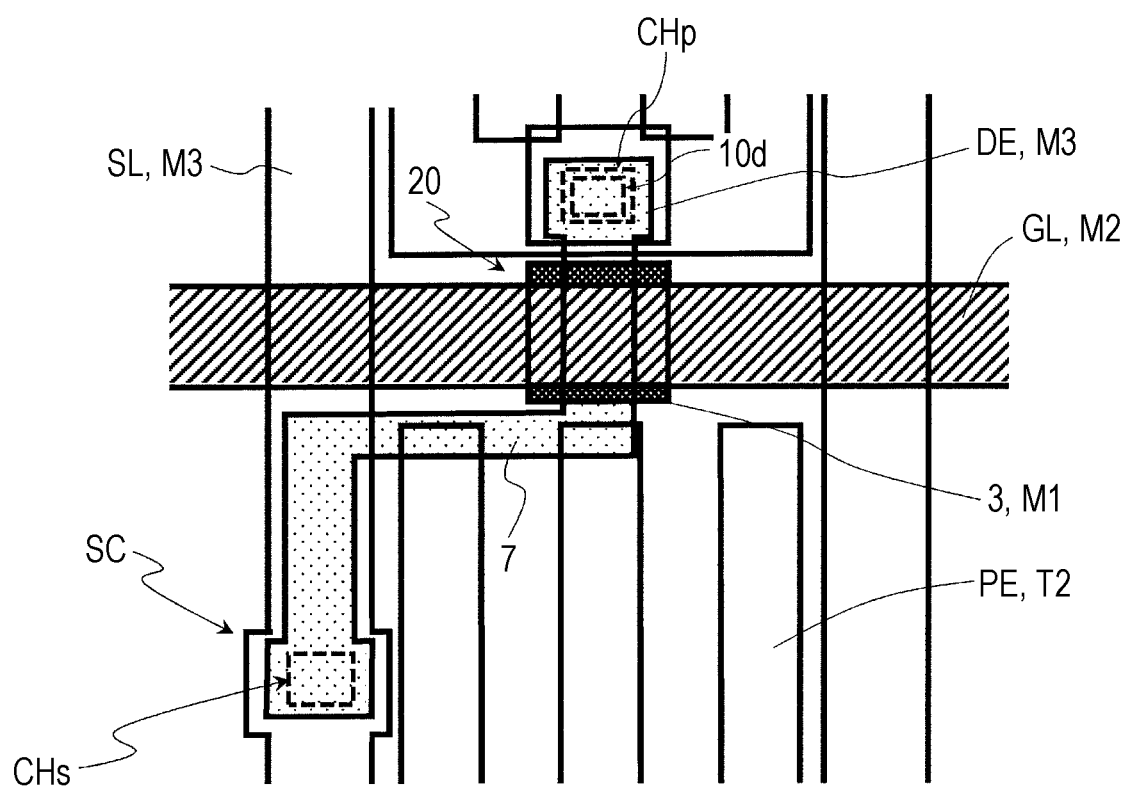
FIG. 3 is a plan view illustrating another active matrix substrate 101.

The source contact hole CHs in the first source contact portion SC1 may at least partially overlap the first source bus line SL1 when viewed from the normal direction of the substrate 1. In this way, it is possible to suppress a decrease in the pixel aperture ratio due to the formation of the source contact portion SC. As shown, the entire source contact hole CHs may overlap the corresponding source bus line SL. Depending on the relationship between the width of the first source bus line SL1 and the width of the source contact hole CHs, the width of the portion of the first source bus line SL1 that overlaps the source contact hole CHs may be larger than the other portions (see FIG. 3).

In the example shown in FIG. 2A, the first region 7s of the first TFT 20a includes a first portion 7s(1) extending in the row direction in the second pixel region PIX2 and a second portion 7s(2) extending in the column direction so as to overlap the first source bus line SL1 when viewed from the normal direction of the substrate 1. The second portion 7s(2) may extend to the source contact hole CHs. By the first region 7s including the second portion 7s(2) extending so as to overlap the first source bus line SL1, it is possible to suppress the influence on the display characteristics due to the lengthening of the first region 7s of the oxide semiconductor layer 7.

Effect

As described above, in the active matrix substrate in the related art, the source contact portion SC is arranged close to the gate bus line GL to suppress the decrease in the pixel aperture ratio. Therefore, when the width of the gate bus line GL varies or the line width of the gate bus line GL becomes partially large due to foreign matters, that is, so-called "pattern thickening" occurs, the gate bus line GL and the source electrode SE of the source contact hole CHs are electrically connected to each other, which may cause leakage between the source and the gate. This is a factor that lowers the yield.

Figure 14:
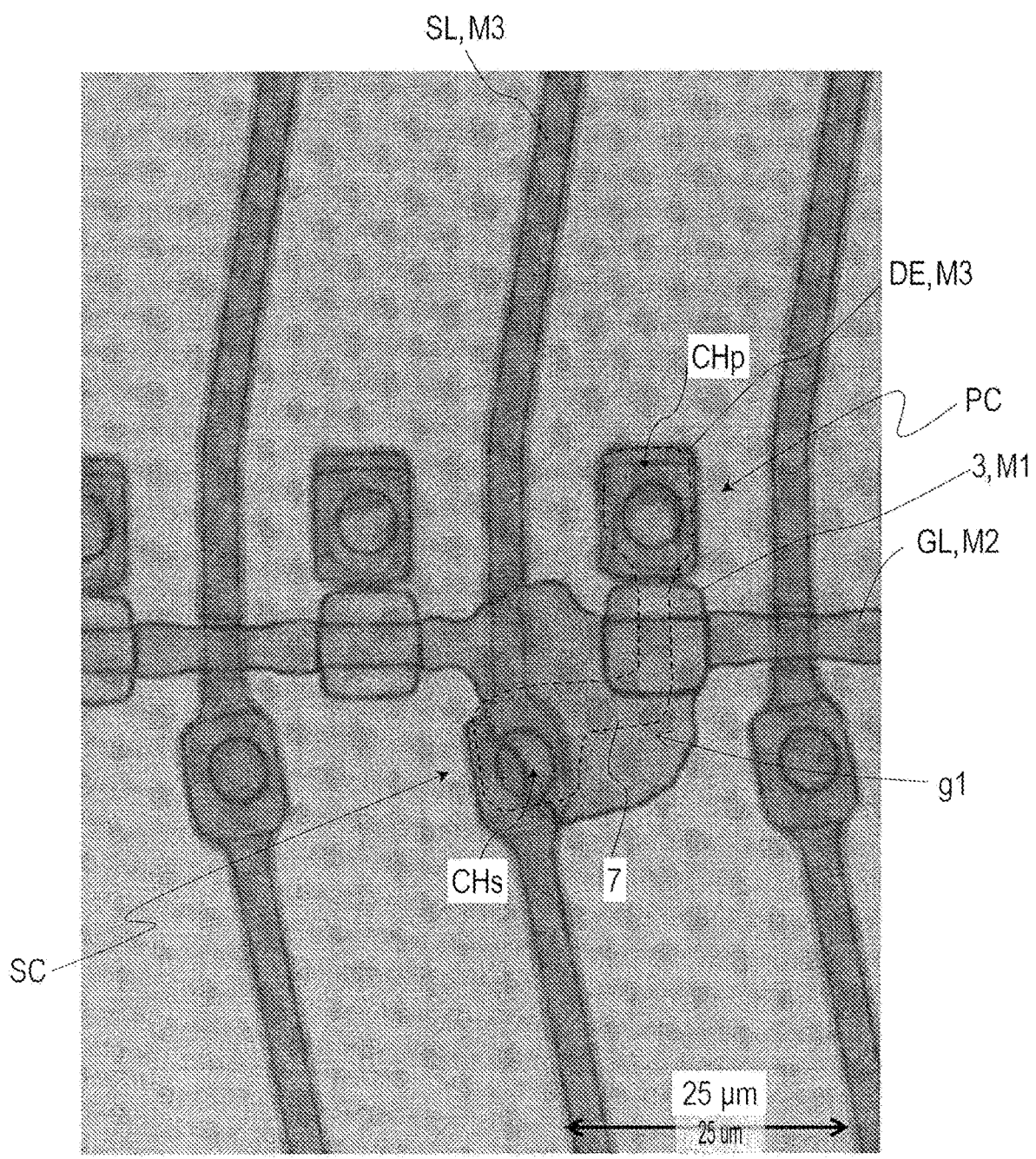
FIG. 14 is a top view illustrating a case where a pattern collapse of a gate bus line GL occurs in an active matrix substrate of the related art.

FIG. 14 is a top view illustrating a state in which pattern thickening of the gate bus line GL occurs on the active matrix substrate of the related art. In this example, the pixel pitch in the row direction 25 μm, the pixel pitch in the column direction is 75 μm, and the interval Dy between the gate bus lines GL is 68 μm. As seen from FIG. 14, when the pattern thickening of the gate bus line GL occurs, in some cases, the line width of a portion g1 of line width of the gate bus line GL has expanded may reach the source contact hole CHs.

In contrast, in the present embodiment, the source contact hole CHs including the first opening portion 10s is arranged well away from the gate bus line GL. In this way, even if the line width of the gate bus line GL varies or the pattern thickening occurs during patterning of the second conductive film, it is possible to suppress leakage between the source and the gate due to the contact between the gate bus line GL and the source electrode SE in the first opening portion 10s.

FIG. 4A is a schematic plan view illustrating a case where pattern thickening occurs in the gate bus line GL in the active matrix substrate 101. FIG. 4B is a schematic plan view illustrating a case where a similar pattern thickening occurs in an active matrix substrate 900 according to a comparative example. The active matrix substrate 900 of the comparative example is different from the active matrix substrate 101 in that the source contact portion SC is located close to the gate bus line GL (the first distance D1 is ⅕ or less of Dy2).

As shown in FIG. 4B, in the active matrix substrate 900 of the comparative example, the expanded portion g1 of the gate bus line G of which the line width is expanded due to the pattern collapse is partially overlaps the source contact hole CHs when viewed from the normal direction of the substrate 1. That is, the expanded portion g1 of the gate bus line GL is in contact with the source electrode SE (or source bus line SL) located in the source contact hole CHs. As a result, the source electrode SE and the gate electrode GE are short-circuited, resulting in a leak defect between the source and the gate.

On the other hand, as shown in FIG. 4A, in the active matrix substrate 101 in the present embodiment, even if pattern thickening occurs in the gate bus line GL, the expanded portion g1 and the source contact hole CHs are not overlapped with each other, and thus the source electrode SE and the gate electrode GE are not short-circuited. When there is no short circuit between the source electrode SE and the gate electrode GE, the product will be a good product even if there is a pattern collapse of the second gate bus line GL2. Therefore, it can be seen that the yield can be improved as compared with the comparative example by changing the location of the source contact hole CHs.

In the present embodiment, the first distance D1 and the second distance D2 may be ⅕ or more of the interval Dy2 of the gate bus line GL. Depending on the pixel pitch, the first distance D1 and the second distance D2 may be ⅓ or more or ⅖ or more of the interval Dy2. This allows the position of the first opening portion 10s (source contact hole CHs) to be further separated from the two gate bus lines GL. Specific values of the first distance D1 and the second distance D2 may vary depending on the line width of the gate bus lines GL and the interval Dy between the gate bus lines GL, and thus are not particularly limited and may be, for example, 25 μm or more.

Method for Manufacturing Active Matrix Substrate 101

FIGS. 5A to 5L are schematic step sectional views illustrating a method for manufacturing the active matrix substrate 101. These drawings illustrate a region (TFT forming region) where a TFT is formed in one pixel region.

Figure 5A:
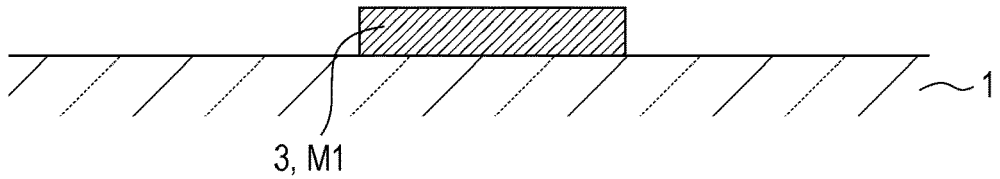
FIG. 5A is a step sectional view illustrating a method for manufacturing the active matrix substrate 101.

Step 1: Formation of First Metal Layer M1 (FIG. 5A)

A first conductive film (thickness: for example, 50 nm or more and 500 nm or less) is formed on the substrate 1 by, for example, a sputtering method. Next, the first conductive film is patterned by a known photolithography step. Here, a resist layer (not illustrated) is formed by forming a resist film on the first conductive film and exposing the resist film with a first metal photomask. Etching (for example, wet etching) of the first conductive film is performed using the resist layer as a mask. In this way, as illustrated in FIG. 5A, the first metal layer M1 including the light shielding layer 3 of the TFT is formed.

As the substrate 1, a transparent and insulating substrate such as a glass substrate or a silicon substrate, a heat-resistant plastic substrate (resin substrate), or the like can be used.

The material of the first conductive film is not particularly limited, a film containing a metal such as aluminum (Al), tungsten (W), molybdenum (Mo), tantalum (Ta), chromium (Cr), titanium (Ti), or copper (Cu), or an alloy thereof, or a metal nitride thereof can be appropriately used. A laminated film in which a plurality of these films are laminated may be used.

Here, a single-layer film of a metal film (including an alloy film) containing Cu or Al is used as the first conductive film. Alternatively, a laminated film having a metal film containing Cu or Al as the uppermost layer may be used.

Step 2: Formation of Lower Insulating Layer 5 (FIG. 5B)

Figure 5B:
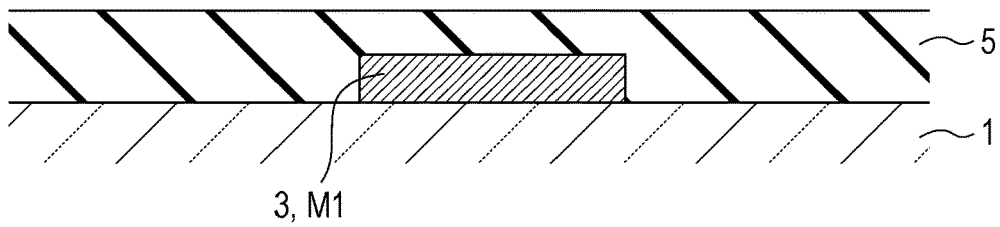
FIG. 5B is a step sectional view illustrating a method for manufacturing the active matrix substrate 101.

Next, as illustrated in FIG. 5B, a lower insulating layer 5 (thickness: for example, 200 nm or more and 600 nm or less) is formed so as to cover the first metal layer M1.

The lower insulating layer 5 is formed by, for example, a CVD method. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like can be appropriately used. The lower insulating layer 5 may be a single layer or may have a laminated structure. For example, a silicon nitride (SiNx) layer, a silicon nitride oxide layer, or the like may be formed on the substrate side (lower layer) to prevent diffusion of impurities and the like from the substrate 1, and a silicon oxide ($SiO_2$) layer, a silicon oxynitride layer, or the like may be formed on a layer thereover (upper layer) to secure insulation. Here, as the lower insulating layer 5, for example, a silicon oxide ($SiO_2$) layer (thickness: 350 nm, for example) is formed by using the CVD method. Alternatively, as the lower insulating layer 5, a laminated film having a silicon nitride (SiNx) layer (thickness: 50 to 600 nm) as a lower layer and a silicon oxide ($SiO_2$) layer (thickness: 50 to 600 nm) as an upper layer may be formed. In a case where an oxide film such as a silicon oxide film is used as the lower insulating layer 5 (in a case where the lower insulating layer 5 has a laminated structure, as an uppermost layer), since oxidation deficiency generated in a channel region of an oxide semiconductor layer formed later can be reduced by the oxide film, reduction in resistance of the channel region can be suppressed.

Figure 5C:
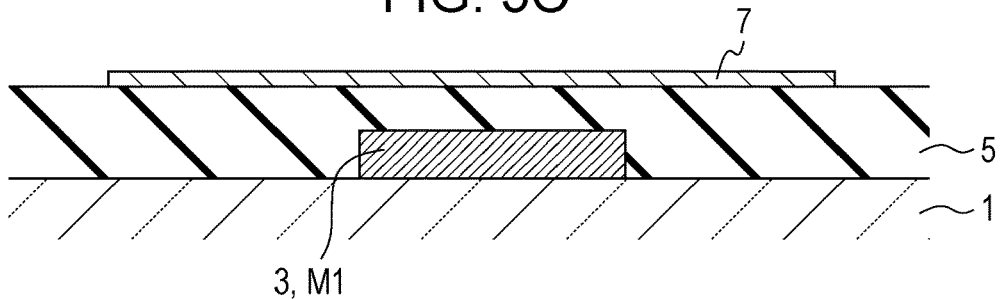
FIG. 5C is a step sectional view illustrating a method for manufacturing the active matrix substrate 101.

Step 3: Formation of Oxide Semiconductor Layer 7 (FIG. 5C)

Subsequently, an oxide semiconductor film (thickness: for example, 15 nm or more and 200 nm or less) is formed on the lower insulating layer 5. Thereafter, annealing treatment of the oxide semiconductor film may be performed. Subsequently, the oxide semiconductor film is patterned by a known photolithography step. As a result, as illustrated in FIG. 5C, an oxide semiconductor layer 7 serving as an active layer of the TFT 20 is obtained.

The oxide semiconductor film can be formed by, for example, a sputtering method. Here, as the oxide semiconductor film, an In-Ga—Zn—O-based semiconductor film (thickness: 50 nm) containing In, Ga, and Zn is formed.

The patterning of the oxide semiconductor film may be performed by wet etching using a PAN-based etching solution containing phosphoric acid, nitric acid, and acetic acid, for example. Alternatively, another etching solution such as an oxalic acid-based etching solution may be used.

Step 4: Formation of Gate Insulating Film 90 (FIG. 5D)

Figure 5D:
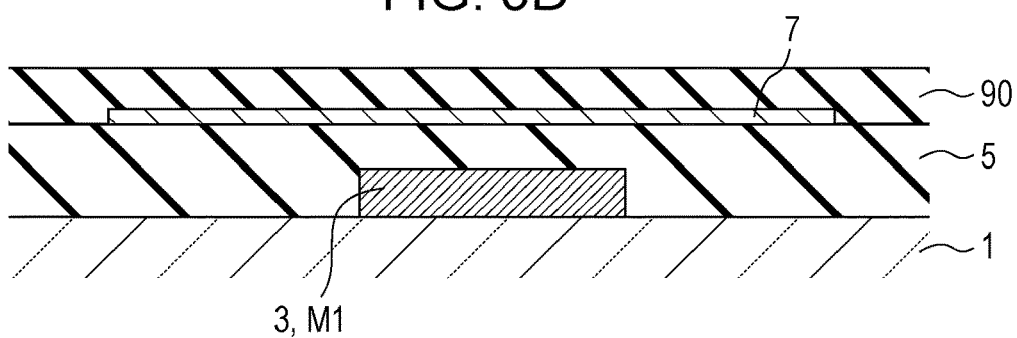
FIG. 5D is a step sectional view illustrating a method for manufacturing the active matrix substrate 101.

Next, as illustrated in FIG. 5D, a gate insulating film 90 is formed so as to cover the oxide semiconductor layer 7.

As the gate insulating film 90, an insulating film similar to the lower insulating layer 5 (insulating film exemplified as the lower insulating layer 5) can be used. Here, a silicon oxide ($SiO_2$) film is formed as the gate insulating film 90. When an oxide film such as a silicon oxide film is used as the gate insulating film 90, since oxidation deficiency generated in the channel region of the oxide semiconductor layer 7 can be reduced by the oxide film, reduction in resistance of the channel region can be suppressed.

Figure 5E:
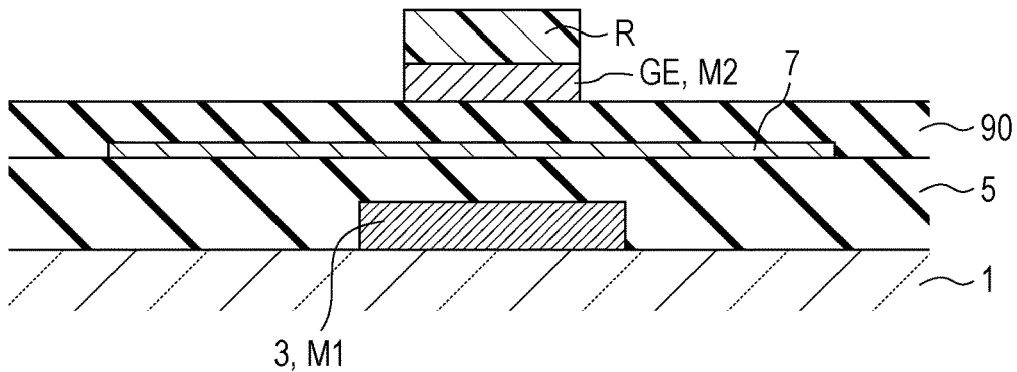
FIG. 5E is a step sectional view illustrating a method for manufacturing the active matrix substrate 101.

Step 5: Formation of Second Metal Layer M2 (FIG. 5E)

Next, a second conductive film (thickness: for example, 50 nm or more and 500 nm or less) (not illustrated) is formed on the gate insulating film 90. Thereafter, the second conductive film is patterned by a known photolithography step. Here, a resist layer R is formed by forming a resist film on the second conductive film and exposing the resist film with a second photomask. Etching (for example, wet etching) of the second conductive film is performed using the resist layer R as a mask. As a result, a second metal layer M2 including the gate bus line GL and the gate electrode GE of the TFT is obtained. The gate bus line GL includes a portion that functions as a gate electrode GE of the TFT.

As the second conductive film, for example, a metal such as molybdenum (Mo), tungsten (W), aluminum (Al), copper (Cu), titanium (Ti), or tantalum (Ta), or an alloy thereof can be used. The second conductive film may have a laminated structure including a plurality of layers formed of different conductive materials. Here, as the second conductive film, a Cu/Ti laminated film having a Ti film as a lower layer and a Cu film as an upper layer, or a Cu/Mo laminated film having a Mo film as a lower layer and a Cu film as an upper layer is used.

Figure 5F:
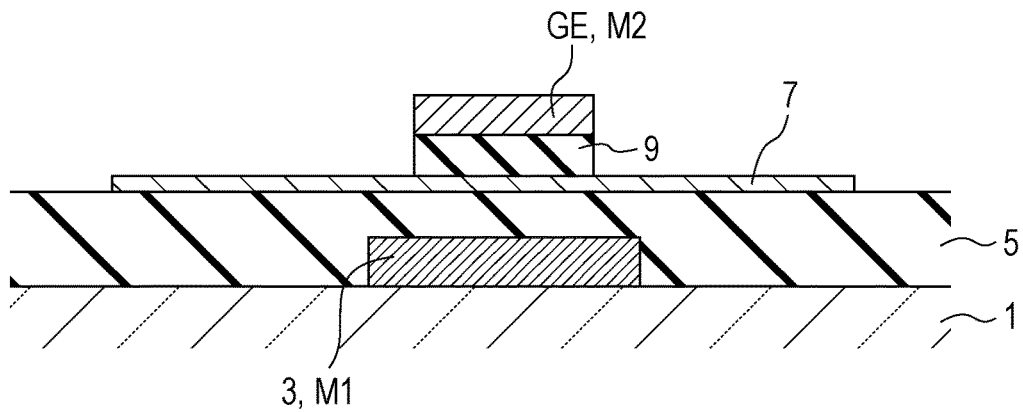
FIG. 5F is a step sectional view illustrating a method for manufacturing the active matrix substrate 101.

Step 6: Patterning of Gate Insulating Layer 9 (FIG. 5F)

Next, the gate insulating film 90 is patterned using the resist layer R as a mask or the second metal layer M2 as a mask to form the gate insulating layer 9. According to this method, the side surface of the gate electrode GE and the side surface of the gate insulating layer 9 are aligned with each other when viewed from the normal direction of the substrate 1.

The gate insulating film 90 and the second conductive film may be patterned separately. Specifically, before forming the second conductive film, the gate insulating film 90 is patterned to form the gate insulating layer 9. Next, the second conductive film may be formed so as to cover the gate insulating layer 9, and the second conductive film may be patterned to form the second metal layer M2. Alternatively, after the gate insulating film 90 is formed, the second conductive film is formed and the second conductive film is patterned. Thereafter, the gate insulating film 90 may be patterned to form the gate insulating layer 9.

Figure 5G:
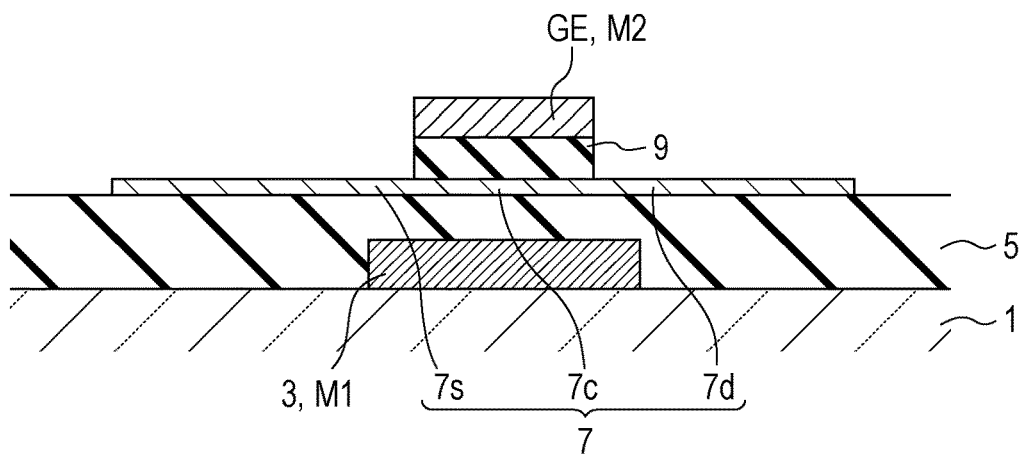
FIG. 5G is a step sectional view illustrating a method for manufacturing the active matrix substrate 101.

Step 7: Resistance Lowering Treatment of Oxide Semiconductor Layer 7 (FIG. 5G)

Subsequently, a resistance lowering treatment of the oxide semiconductor layer 7 is performed. For example, as the resistance lowering treatment, a plasma treatment may be performed. As a result, as illustrated in FIG. 5G, when viewed from the normal direction of the main surface of the substrate 1, a region (exposed region) of the oxide semiconductor layer 7, which does not overlap the gate bus line GL (or gate electrode GE) or the gate insulating layer 9 is a low resistance region having a lower specific resistance than that of a region that overlaps these line and layer (here, region to be the channel). The low resistance region may be a conductor region (for example, sheet resistance: 200Ω/☐ or less). In this way, the oxide semiconductor layer 7 including the first region 7s and the second region 7d, which are low resistance regions, and the channel region 7c remaining as a semiconductor region without being reduced in resistance is obtained.

The method of resistance lowering treatment (plasma treatment) is not limited to the above. For example, the resistance of the exposed region of the oxide semiconductor layer 7 may be lowered by a reducing plasma or a plasma containing a doping element (for example, argon plasma). The method and conditions for the resistance lowering treatment are described in, for example, Japanese Unexamined Patent Application Publication No. 2008-40343. For reference, the entire disclosure of Japanese Unexamined Patent Application Publication No. 2008-40343 is incorporated herein.

Figure 5H:
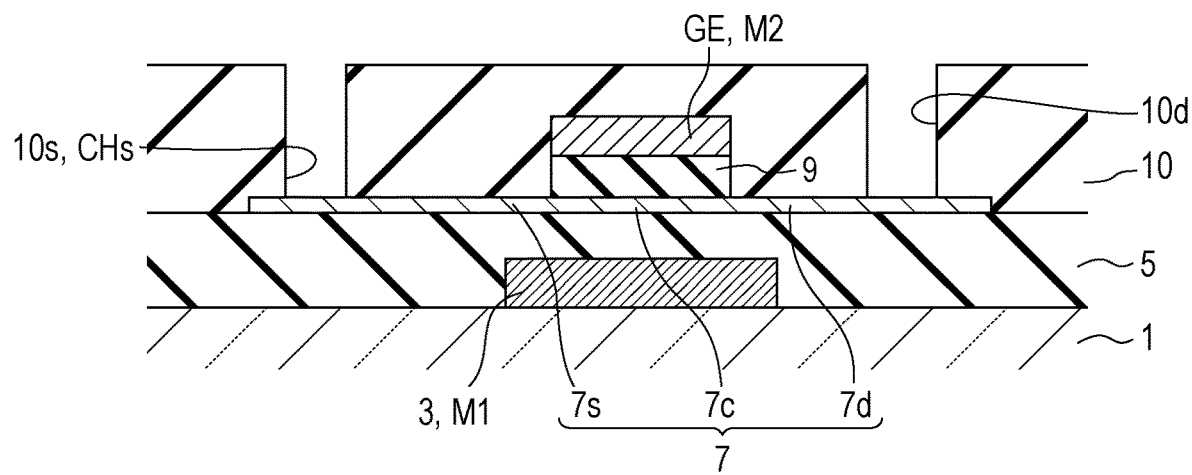
FIG. 5H is a step sectional view illustrating a method for manufacturing the active matrix substrate 101.

Step 8: Formation of Interlayer Insulating Layer 10 (FIG. 5H)

Next, an interlayer insulating layer 10 covering the oxide semiconductor layer 7, the gate insulating layer 9, and the gate electrode GE is formed. Thereafter, the interlayer insulating layer 10 and the lower insulating layer 5 are patterned by a known photolithography step. As a result, as illustrated FIG. 5H, the interlayer insulating layer 10 is formed with a first opening portion 10s (source contact hole CHs) that exposes a portion of the first region 7s of the oxide semiconductor layer 7 and a second opening portion 10d that exposes a portion of the second region 7d.

As the interlayer insulating layer 10, an inorganic insulating layer such as a silicon oxide film, a silicon nitride film, a silicon oxynitride film, a silicon nitride oxide film, or the like can be formed as a single layer or a laminated layer. The thickness of the inorganic insulating layer may be 100 nm or more and 500 nm or less. When the interlayer insulating layer 10 is formed using an insulating film such as a silicon nitride film that reduces an oxide semiconductor, this is preferable because the specific resistance of a region (here, a low resistance region) in contact with the interlayer insulating layer 10 in the oxide semiconductor layer 7 can be maintained low. Here, as the interlayer insulating layer 10, for example, a SiNx layer (thickness: 300 nm) is formed by a CVD method.

In a case where an insulating layer that can reduce an oxide semiconductor (for example, hydrogen-donating layer such as a silicon nitride layer) is used as the interlayer insulating layer 10, even without performing the above-described resistance lowering treatment, a portion of the oxide semiconductor layer 7 that is in contact with the interlayer insulating layer 10 can have a lower resistance than a portion that is not in contact.

Figure 5I:
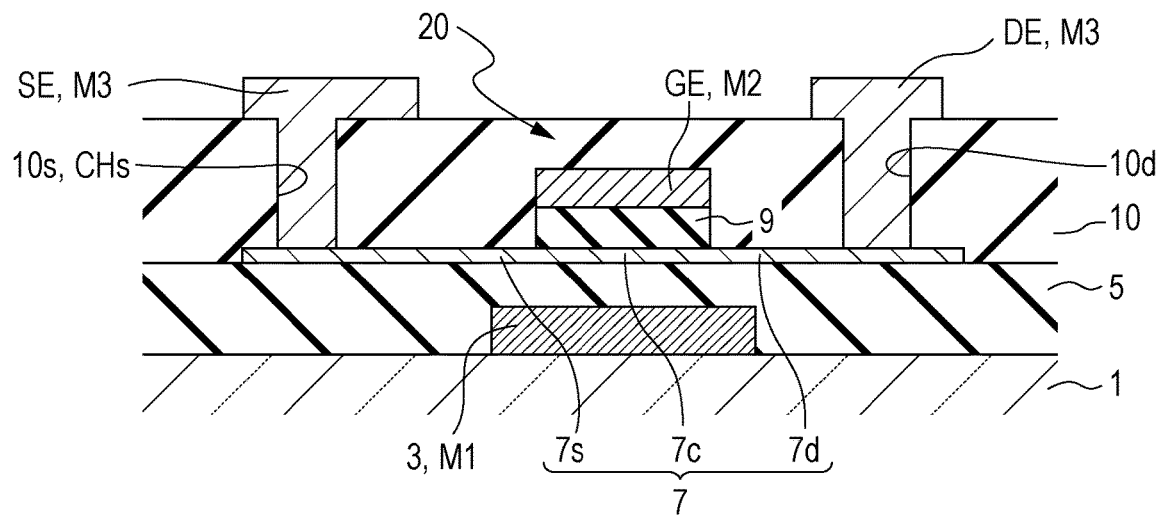
FIG. 5I is a step sectional view illustrating a method for manufacturing the active matrix substrate 101.

Step 9: Formation of Third Metal Layer M3 (FIG. 5I)

Next, a third conductive film (thickness: for example, 50 nm or more and 500 nm or less) (not illustrated) is formed on the interlayer insulating layer 10, and the third conductive film is patterned. As a result, as illustrated in FIG. 5I, a third metal layer M3 including the source bus line SL, the source electrode SE, and the drain electrode DE is formed.

The source electrode SE is disposed on the interlayer insulating layer 10 and in the source contact hole CHs (here, the first opening portion 10s), and is connected to the first region 7s of the oxide semiconductor layer 7 in the source contact hole CHs. The drain electrode DE is disposed on the interlayer insulating layer 10 and in the second opening portion 10d, and is connected to the second region 7d of the oxide semiconductor layer 7 in the second opening portion 10d.

As the third conductive film, for example, an element selected from aluminum (Al), chromium (Cr), copper (Cu), tantalum (Ta), titanium (Ti), molybdenum (Mo), or tungsten (W), or an alloy containing these elements as components can be used. For example, the third conductive film may have a three-layer structure of a titanium film-aluminum film-titanium film, a three-layer structure of a molybdenum film-aluminum film-molybdenum film, or the like. The third conductive film is not limited to the three-layer structure, and may have a single layer, a two-layer structure, or a laminated structure of four or more layers. Here, a laminated film in which a Ti film (thickness: 15 to 70 nm) is a lower layer and a Cu film (thickness: 50 to 400 nm) is an upper layer is used. When a laminated film having an ohmic conductive film as the lowermost layer such as a Ti film is used, the contact resistance of the source contact portion can be reduced more effectively.

Step 10: Formation of Inorganic Insulating Layer 11 and Organic Insulating Layer 12 (FIG. 5J)

Figure 5J:
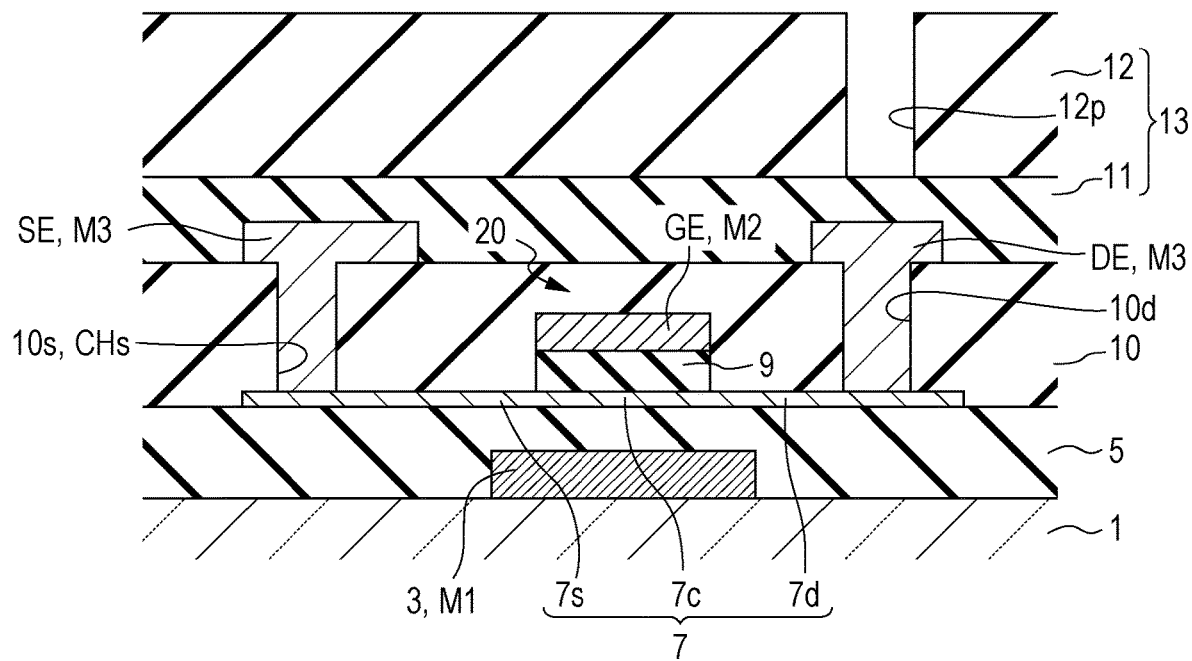
FIG. 5J is a step sectional view illustrating a method for manufacturing the active matrix substrate 101.

Next, as illustrated in FIG. 5J, an upper insulating layer 13 is formed so as to cover the interlayer insulating layer 10 and the third metal layer M3. Here, as the upper insulating layer 13, an inorganic insulating layer 11 (thickness: for example, 100 nm or more and 500 nm or less) and an organic insulating layer 12 (thickness: for example, 1 to 4 μm, preferably 2 to 3 μm) are formed in this order.

As the inorganic insulating layer 11, the inorganic insulating film similar to the interlayer insulating layer 10 can be used. Here, as the inorganic insulating layer 11, for example, a SiNx layer (thickness: 300 nm) is formed by a CVD method. The organic insulating layer 12 may be, for example, an organic insulating film (for example, acrylic resin film) containing a photosensitive resin material.

Thereafter, the organic insulating layer 12 is patterned. As a result, in each pixel region, an opening portion 12p exposing a portion of the inorganic insulating layer 11 is formed in the organic insulating layer 12. The opening portion 12p is disposed so as to overlap the drain electrode DE when viewed from the normal direction of the substrate 1. By this patterning, the entire portion of the organic insulating layer 12 located in the non-display region may be removed.

Step 11: Formation of Common Electrode CE (FIG. 5K)

Figure 5K:
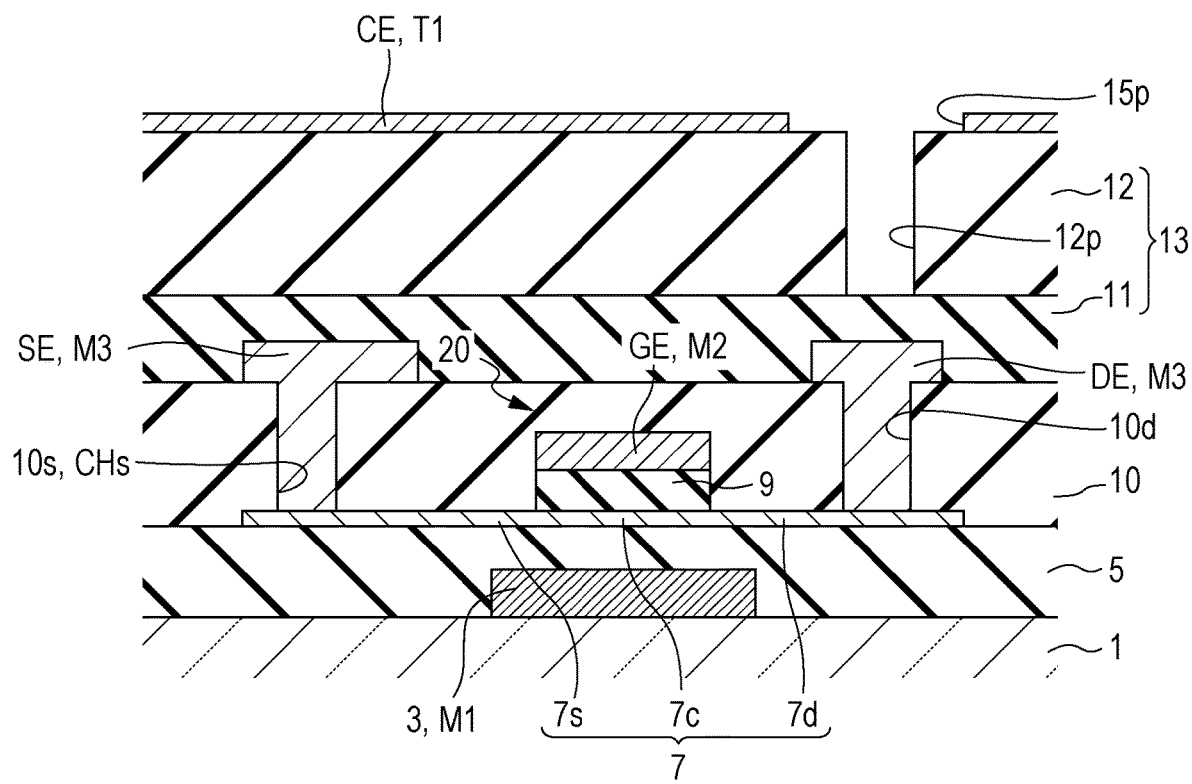
FIG. 5K is a step sectional view illustrating a method for manufacturing the active matrix substrate 101.

Subsequently, as illustrated in FIG. 5K, a common electrode CE is formed on the upper insulating layer 13.

First, a first transparent conductive film (thickness: 20 to 300 nm) (not illustrated) is formed on the upper insulating layer 13 and in the opening portion 12p. Here, for example, an indium-zinc oxide film is formed as the first transparent conductive film by a sputtering method. As the material of the first transparent conductive film, metal oxides such as indium-tin oxide (ITO), indium-zinc oxide, and ZnO can be used. Thereafter, the first transparent conductive film is patterned. In patterning, for example, wet etching may be performed using an oxalic acid-based etching solution. As a result, a common electrode CE is obtained. The common electrode CE may have an opening portion 15p, for example, on the region where the pixel contact hole is formed.

Step 12: Formation of Dielectric Layer 17 (FIG. 5L)

Figure 5L:
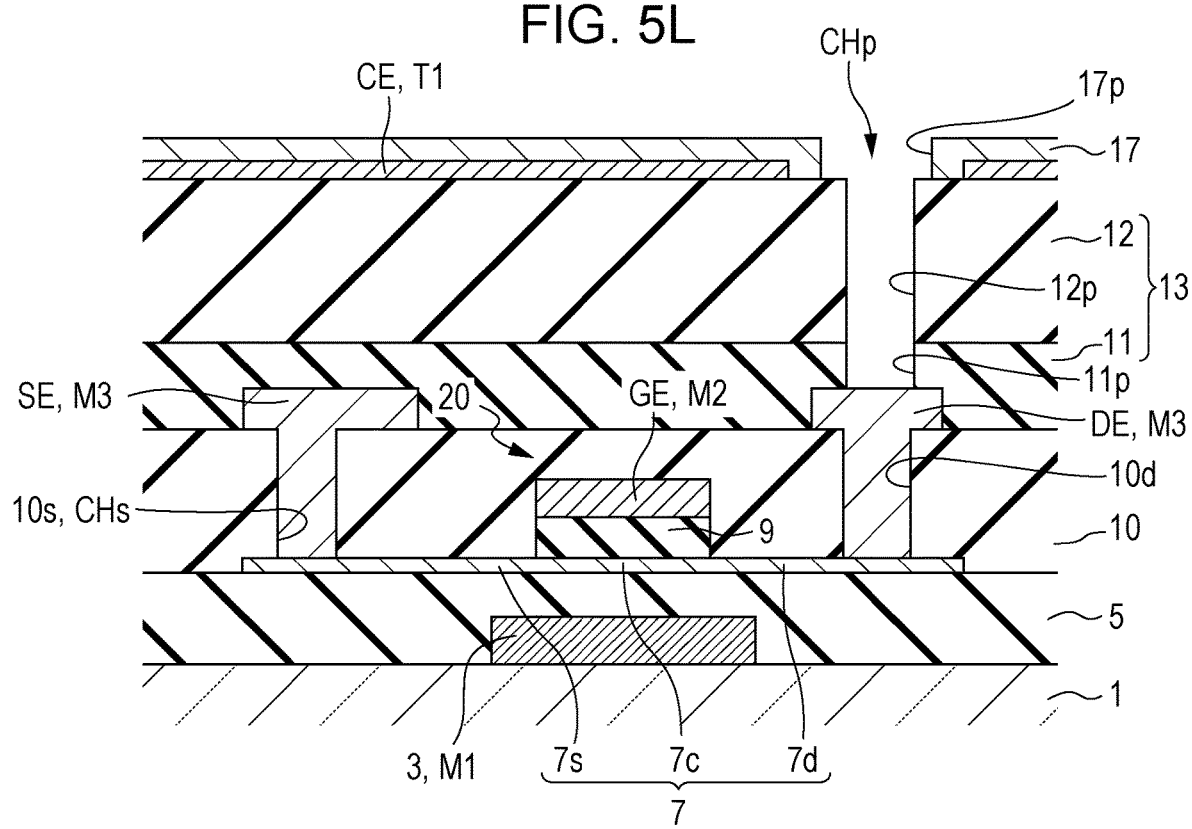
FIG. 5L is a step sectional view illustrating a method for manufacturing the active matrix substrate 101.

Next, as illustrated in FIG. 5L, a dielectric layer (thickness: 50 to 500 nm) 17 is formed so as to cover the common electrode CE, and the dielectric layer 17 and the inorganic insulating layer 11 are patterned.

The dielectric layer 17 is formed on the organic insulating layer 12 and the common electrode CE and in the opening portion 12p in the pixel region. The material of the dielectric layer 17 may be the same as the material exemplified as the material of the inorganic insulating layer 11. Here, a SiN film is formed as the dielectric layer 17 by, for example, a CVD method.

Thereafter, the dielectric layer 17 and the inorganic insulating layer 11 are etched by a known photolithography step to form a pixel contact hole CHp that exposes the drain electrode DE. In this example, the pixel contact hole CHp includes the opening portion 17p of the dielectric layer 17, the opening portion 12p of the organic insulating layer 12, and the opening portion 11p of the inorganic insulating layer 11. The opening portion 17p may be at least partially overlapped the opening portion 12p when viewed from the normal direction of the substrate 1. The opening portion 11p is etched using the resist layer (not illustrated) on the dielectric layer 17 and the organic insulating layer 12 as masks.

Step 13: Formation of Pixel Electrode PE (FIGS. 2A and 2B)

Next, a second transparent conductive film (not illustrated) (thickness: 20 to 300 nm) is formed on the dielectric layer 17 and in the pixel contact hole CHp. The second transparent conductive film can be formed by using the same material as that of the first transparent conductive film.

Thereafter, the second transparent conductive film is patterned. Here, for example, the second transparent conductive film is wet-etched using an oxalic acid-based etching solution. As a result, the pixel electrode PE is formed in each pixel region. The pixel electrode PE is connected to the drain electrode DE in the pixel contact hole CHp. In this way, the active matrix substrate 101 illustrated in FIGS. 2A and 2B is manufactured.

Second Embodiment

An active matrix substrate 102 according to the second embodiment is different from the active matrix substrate 101 of the above-described embodiment in that the source bus line SL is formed in the first metal layer M1 (has a lower source substrate structure).

Figure 6A:
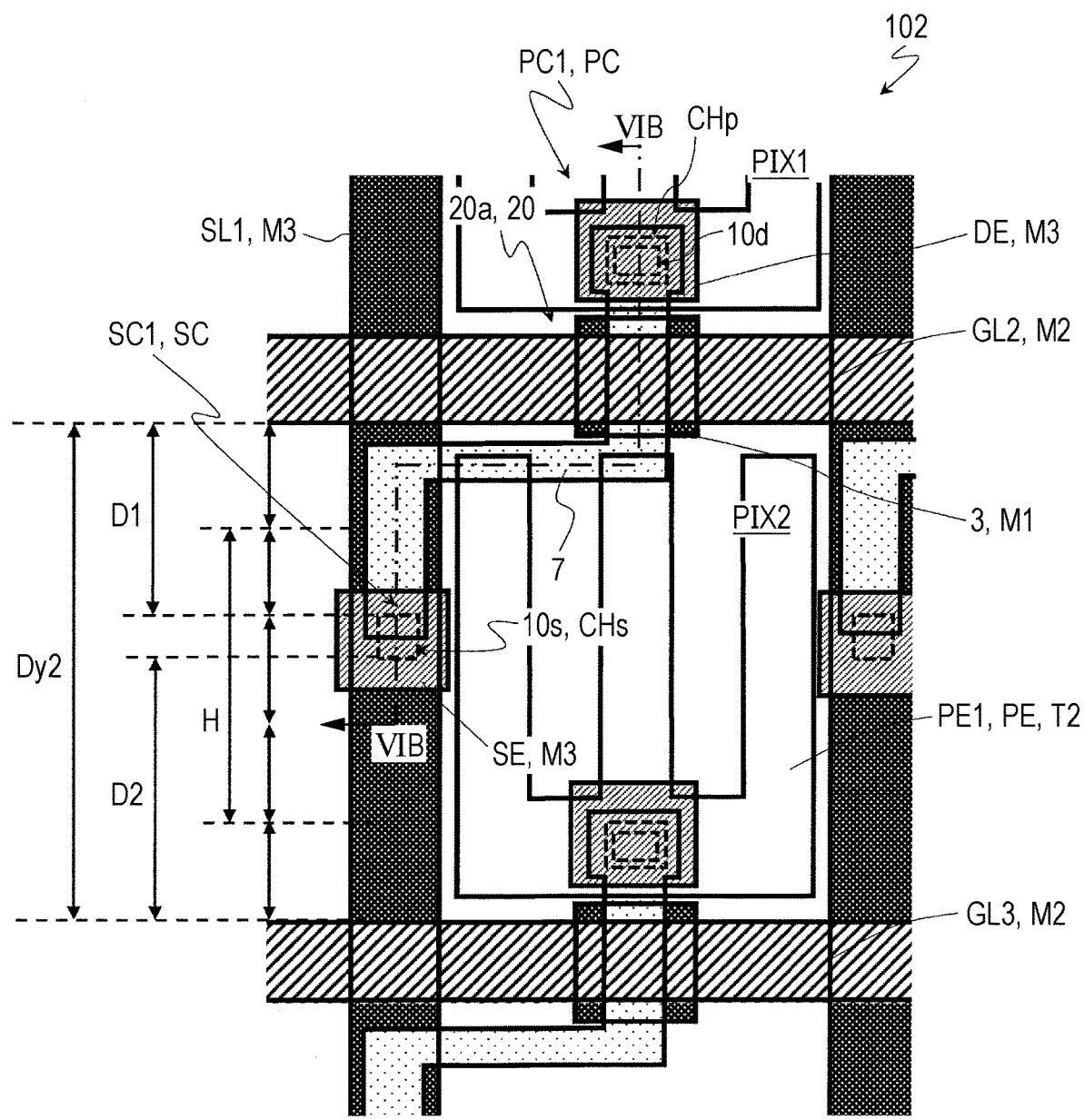
FIG. 6A is a plan view illustrating a pixel region in an active matrix substrate 102 according to a second embodiment.
Figure 6B:
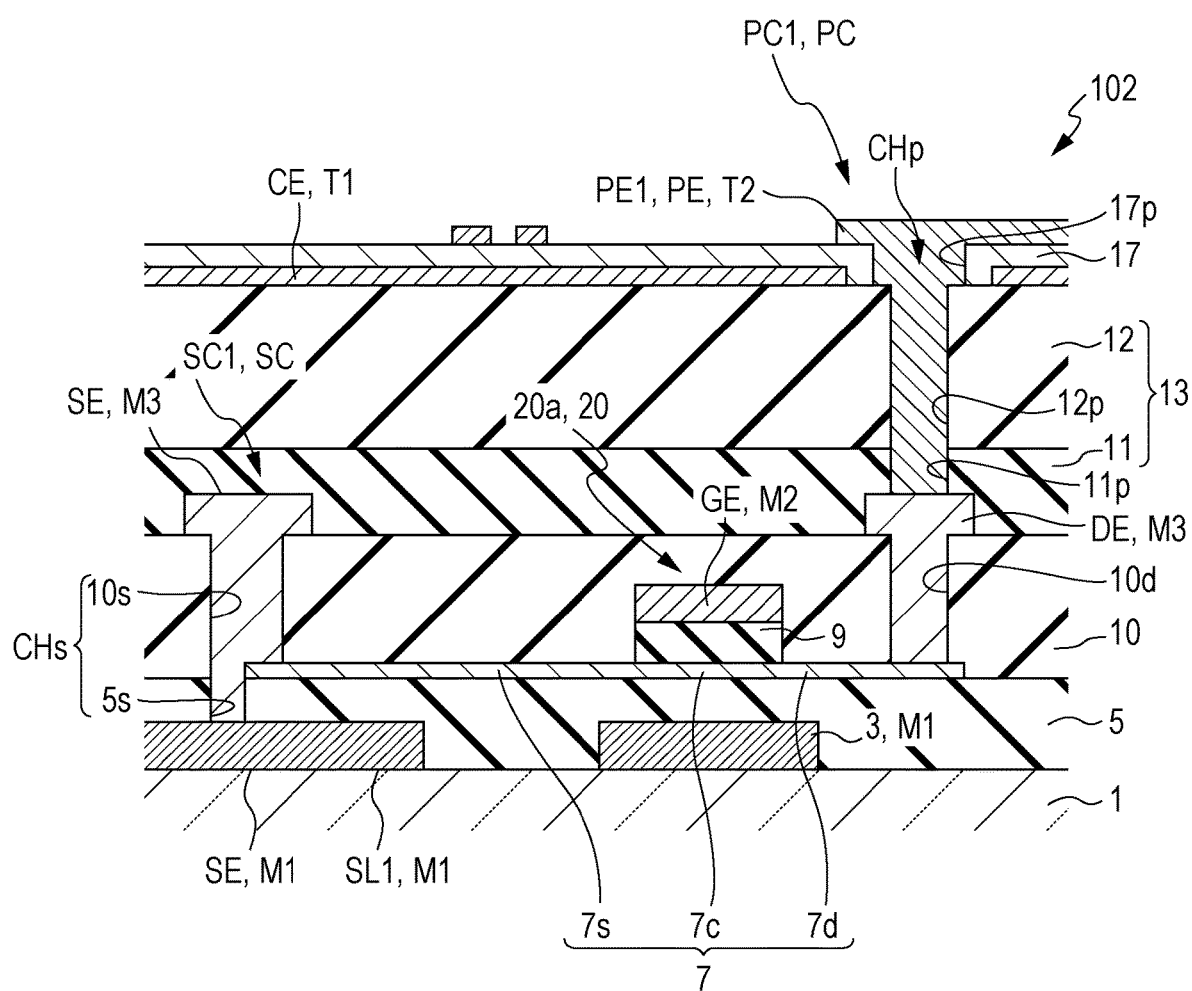
FIG. 6B is a cross-sectional view of the active matrix substrate 102 taken along the line VIB-VIB illustrated in FIG. 6A.

FIG. 6A is a plan view illustrating a pixel region in an active matrix substrate 102 according to the second embodiment, and FIG. 6B is a cross-sectional view taken along the line VIB-VIB across the TFT 20 of the pixel region. The same reference numerals are given to the same components as those in FIGS. 2A and 2B, and the description thereof will be omitted.

In the present embodiment, the plurality of source bus lines SL are formed in the first metal layer M1. The oxide semiconductor layer 7 of the TFT 20, the gate insulating layer 9, the second metal layer M2 including the gate electrode GE and the plurality of the gate bus lines GL of the TFT, the interlayer insulating layer 10 covering the second metal layer M2, and the third metal layer M3 are formed on the lower insulating layer 5 covering the first metal layer M1 in this order. In the present embodiment, the third metal layer M3 includes a source electrode SE and a drain electrode DE of the TFT 20. A lower transparent conductive layer T1, a dielectric layer 17, and an upper transparent conductive layer T2 are formed on the third metal layer M3 as in the above-described embodiment.

Next, taking the first TFT 20a and the first source contact portion SC1 associated with the first pixel region PIX1 as an example, the structure and the disposition of the TFT 20 and the source contact portion SC according to the present embodiment will be described.

In the present embodiment, the source contact hole CHs is formed in the lower insulating layer 5 and the interlayer insulating layer 10, and exposes a portion of the first source bus line SL1 and a portion of the first region 7s of the oxide semiconductor layer 7 in the TFT 20a. The source contact hole CHs includes a lower opening portion 5s formed in the lower insulating layer 5 and a first opening portion 10s formed in the interlayer insulating layer 10. For example, the source contact holes CHs can be formed by etching the interlayer insulating layer 10 and the lower insulating layer 5 with the oxide semiconductor layer 7 as an etching stop. In this case, the side surface of the oxide semiconductor layer 7 is aligned with the side surface of the lower opening portion 5s in the source contact hole CHs. In the present embodiment, when viewed from the normal direction of the substrate 1, the edge (peripheral edge) of the oxide semiconductor layer 7 extends across the first opening portion 10s. Further, when viewed from the normal direction of the substrate 1, the lower opening portion 5s is disposed inside the first opening portion 10s and does not overlap the oxide semiconductor layer 7.

The source electrode SE is disposed on the interlayer insulating layer 10 and in the source contact hole CHs, and is connected to the exposed portion of the first source bus line SL1 and the exposed portion of the first region 7s of the oxide semiconductor layer 7 (here, the upper surface and the side surface of the end portion of the first region 7s) in the source contact hole CHs. The source electrode SE may be in direct contact with both the first source bus line SL1 and the first region 7s.

When viewed from the normal direction of the substrate 1, the ratio of an area of the portion where the first opening portion 10s and the oxide semiconductor layer 7 overlap each other (that is, contact area between the connection electrode 8 and the upper surface of the oxide semiconductor layer 7) to an entire area of the first opening portion 10s may be, for example, ⅓ or more and ⅔ or less.

Also in the present embodiment, in the first source contact portion SC, the source contact hole CHs including the first opening portion 10s formed in the interlayer insulating layer 10 is disposed in the region H located between the two adjacent gate bus lines GL. That is, a first distance D1 in the column direction between the second gate bus line GL2 and the first opening portion 10s and a second distance D2 in the column direction between the third gate bus line GL3 and the first opening portion 10s are both ⅕ or more of the interval Dy2 in the column direction between the second gate bus line GL2 and the third gate bus line GL3. As a result, even if the width of the second gate bus line GL2 or the third gate bus line GL3 becomes irregular or the pattern thickening occurs due to foreign matter, leakage between the source and the gate due to electrical connection the second gate bus line GL2 or the third gate bus line GL3 and the source electrode SE in the source contact hole CHs can be suppressed.

Figure 7A:
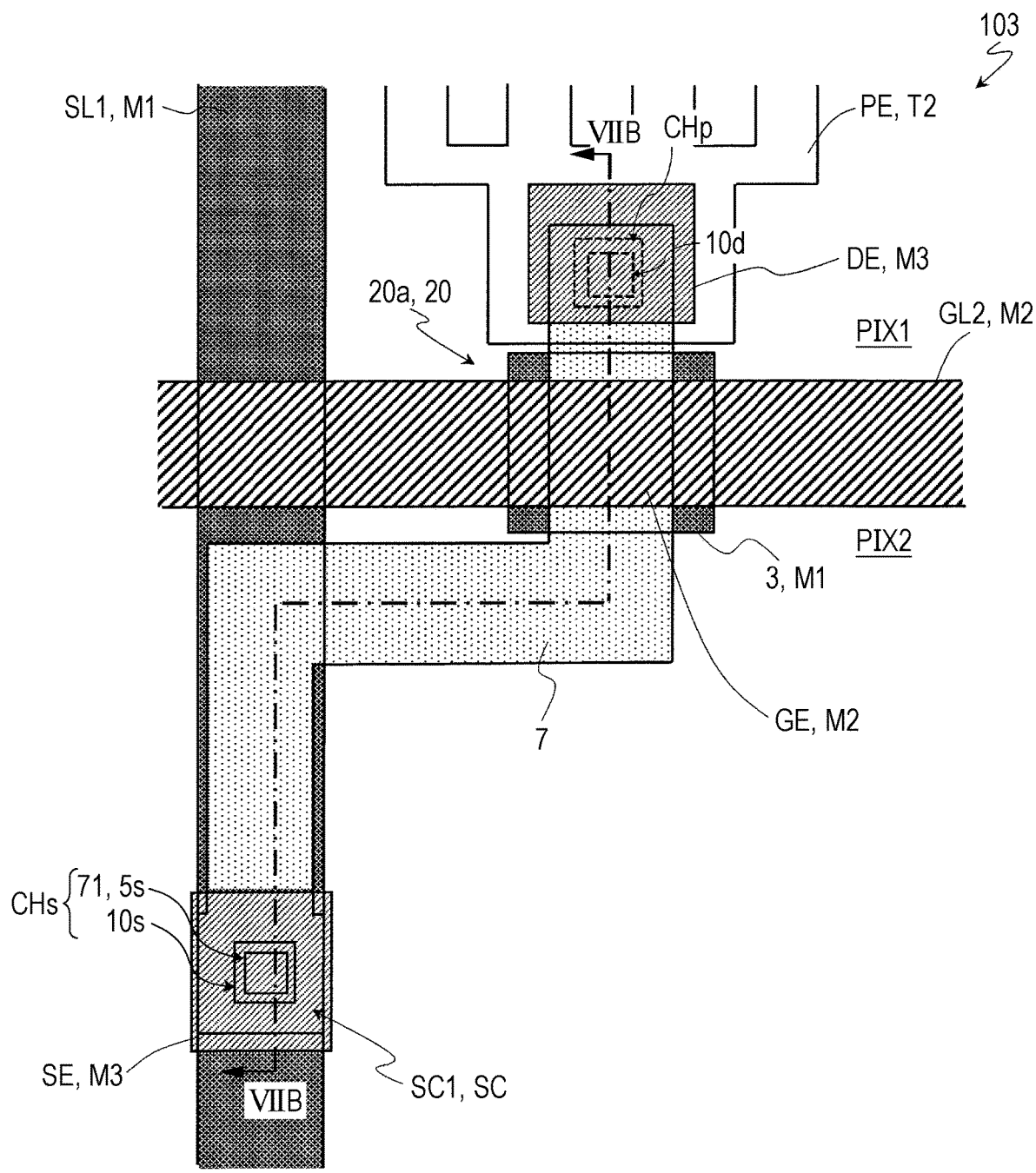
FIG. 7A is a plan view illustrating a pixel region in another active matrix substrate 103 according to the second embodiment.
Figure 7B:
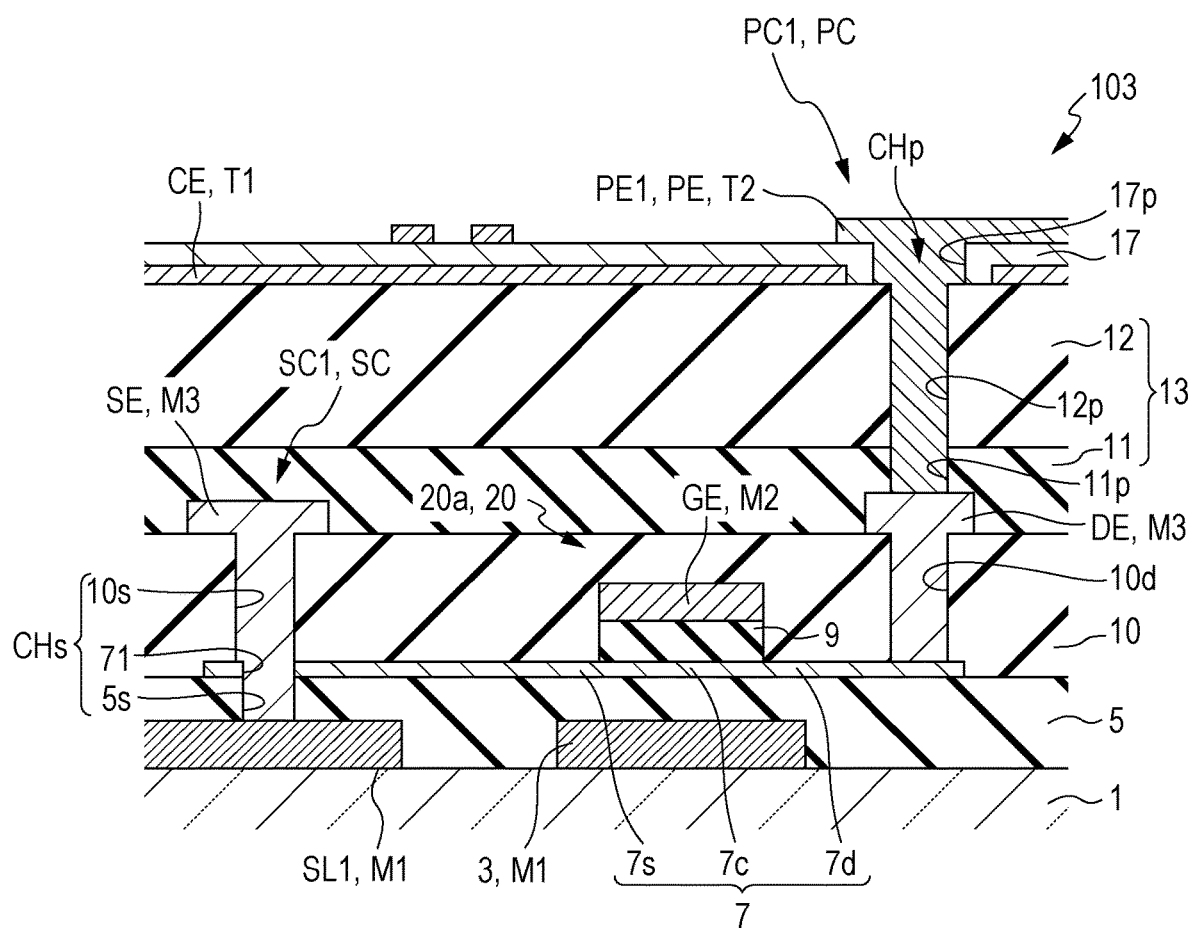
FIG. 7B is a cross-sectional view of the active matrix substrate 103 taken along the line VIIB-VIIB illustrated in FIG. 7A.

FIG. 7A is a plan view illustrating a pixel region in another active matrix substrate 103 according to the second embodiment, and FIG. 7B is a cross-sectional view taken along the line VIIB-VIIB across the TFT 20 of the pixel region.

The active matrix substrate 103 is different from the active matrix substrate 102 in that an opening portion 71 is formed in the first region 7s of the oxide semiconductor layer 7 in the source contact portion SC. Instead of providing the opening portion 71 in the oxide semiconductor layer 7, a notched portion may be provided.

In the active matrix substrate 103, the source contact hole CHs includes the lower opening portion 5s of the lower insulating layer 5, the opening portion 71 (or the notched portion) of the oxide semiconductor layer 7, and the first opening portion 10s of the interlayer insulating layer 10. The first opening portion 10s is disposed so as to at least partially overlap the opening portion 71 of the oxide semiconductor layer 7 when viewed from the normal direction of the substrate 1. When viewed from the normal direction of the substrate 1, the opening portion 71 and the lower opening portion 5s may be located inside the first opening portion 10s. As a result, the contact area between the source electrode SE and the oxide semiconductor layer 7 can be maintained even in a case where the misalignment occurs. In a case where the opening portion 71 of the oxide semiconductor layer 7 is located inside the first opening portion 10s, the entire side surface of the lower opening portion 5s can be aligned with the side surface of the opening portion 71. Such a structure can be formed by etching the lower insulating layer 5 and the interlayer insulating layer 10 with the oxide semiconductor layer 7 as an etching stop.

Method for Manufacturing Active Matrix Substrate 102

Next, an example of a method for manufacturing the active matrix substrate 102 according to the present embodiment will be described with reference to the drawings. Hereinafter, a method for manufacturing one pixel region of the plurality of pixel regions in the active matrix substrate 102 will be described. Description of the material, thickness, forming process, and the like of each layer will be omitted when they are the same as those of the active matrix substrate 101 (see FIGS. 5A to 5L). By making the pattern of the oxide semiconductor layer 7 different, the active matrix substrate 103 can also be manufactured by the same method as the active matrix substrate 102.

FIGS. 8A to 8D are schematic step sectional views illustrating a method for manufacturing the active matrix substrate 102.

Figure 8A:
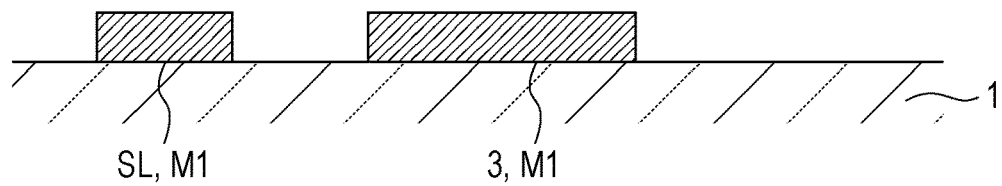
FIG. 8A is a step sectional view illustrating a method for manufacturing the active matrix substrate 102.

A first conductive film is formed on the substrate 1, and the first conductive film is patterned. As a result, as illustrated in FIG. 8A, the first metal layer M1 including the source bus line SL and the light shielding layer 3 of the TFT is formed (STEP 1).

In a case where the source bus line SL is directly connected to the oxide semiconductor layer 7, an ohmic conductive film such as a Ti film may be provided on the uppermost layer of the source bus line SL in order to reduce the contact resistance. In contrast, in the present embodiment, since the source bus line SL is connected to the oxide semiconductor layer 7 via the source electrode SE, it is not necessary to provide the ohmic conductive film on the uppermost layer of the source bus line SL. Therefore, as the first conductive film, a single-layer film of a metal film containing Cu or Al, or a laminated film having such a metal film as the uppermost layer may be used.

Figure 8B:
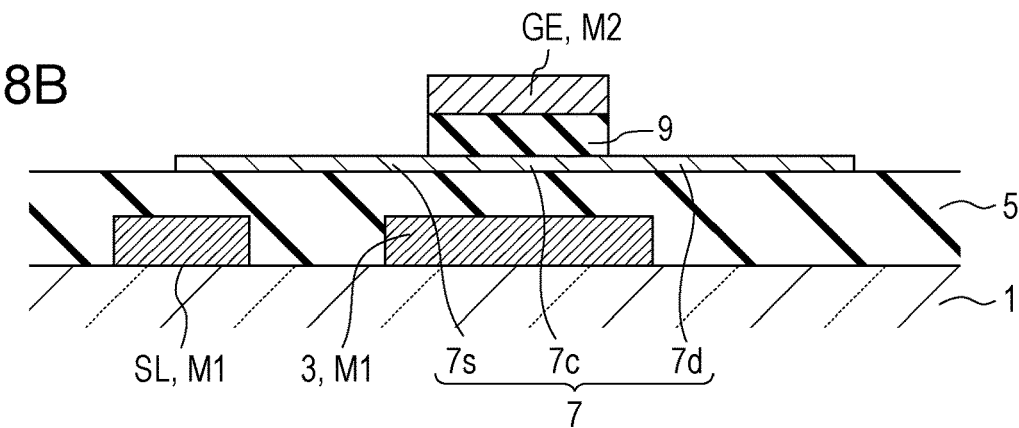
FIG. 8B is a step sectional view illustrating a method for manufacturing the active matrix substrate 102.

Next, as illustrated in FIG. 8B, as in the above-described embodiment, a lower insulating layer 5 covering the first metal layer M1 is formed, and an oxide semiconductor layer 7, a gate insulating layer 9, and a gate electrode GE are formed on the lower insulating layer 5 (STEPs 2 to 6). After that, low resistance treatment of the oxide semiconductor layer 7 may be performed (STEP 7).

Figure 8C:
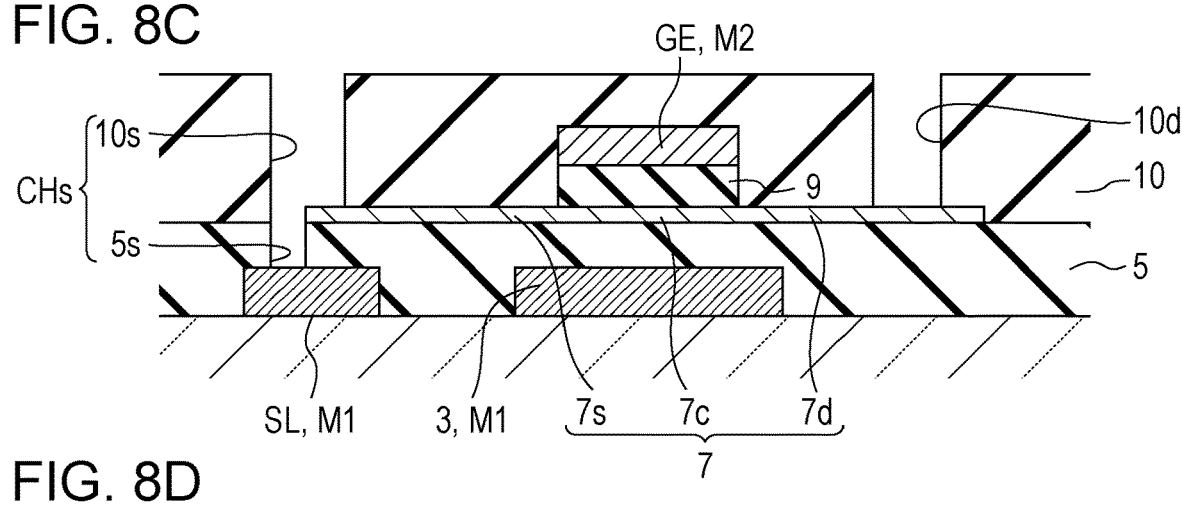
FIG. 8C is a step sectional view illustrating a method for manufacturing the active matrix substrate 102.

Next, an interlayer insulating layer 10 covering the oxide semiconductor layer 7, the gate insulating layer 9, and the gate electrode GE is formed (STEP 8). Thereafter, the interlayer insulating layer 10 and the lower insulating layer 5 are patterned by a known photolithography step. As a result, as illustrated in FIG. 8C, in the interlayer insulating layer 10 and the lower insulating layer 5, the interlayer insulating layer 10 is formed with a source contact hole CHs that exposes a portion of the source bus line SL and a portion of the first region 7s of the oxide semiconductor layer 7 and a second opening portion 10d that exposes a portion of the second region 7d of the oxide semiconductor layer 7. The source contact hole CHs includes a lower opening portion 5s formed in the lower insulating layer 5 and a first opening portion 10s formed in the interlayer insulating layer 10.

The patterning of the interlayer insulating layer 10 and the lower insulating layer 5 can be performed by, for example, dry etching. The dry etching is performed under the condition that the oxide semiconductor layer 7 is not etched and only these insulating layers are etched. As a result, since the oxide semiconductor layer 7 functions as an etch stop, a portion of the side surface of the lower opening portion 5s formed in the lower insulating layer 5 is aligned with the side surface of the oxide semiconductor layer 7, and the other portion is aligned with the side surface of the first opening portion 10s in the source contact hole CHs.

In the present embodiment, for example, carbon tetrachloride ($CF_4$) gas and oxygen ($O_2$) gas ($CF_4/O_2$) are used as the etching gas in the patterning step of the interlayer insulating layer 10 and the lower insulating layer 5. An inert gas such as Ar gas may be added as appropriate. The etching conditions (type of etching gas, substrate temperature, degree of vacuum in the chamber, and the like) are set to conditions capable of suppressing damage to the oxide semiconductor layer 7. As an example, in a case where $CF_4/O_2$ is used as the etching gas, when the flow rate of the O2 gas is increased (for example, the flow rate ratio of the O2 gas to the $CF_4$ gas is approximately 10% to 25%), since the surface of the oxide semiconductor layer 7 is unlikely to be scraped, damage to the oxide semiconductor layer 7 can be reduced.

Figure 8D:
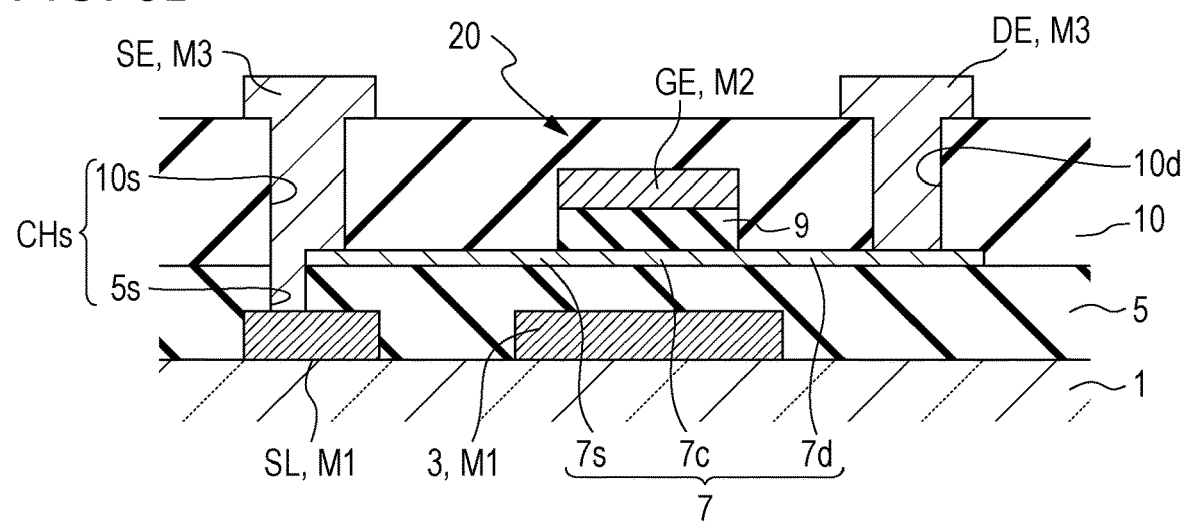
FIG. 8D is a step sectional view illustrating a method for manufacturing the active matrix substrate 102.

Next, as illustrated in FIG. 8D, a third conductive film is formed on the interlayer insulating layer 10, and a third metal layer M3 including a source electrode SE and a drain electrode DE is formed by patterning the third conductive film (STEP 9). The source electrode SE is disposed on the interlayer insulating layer 10 and in the source contact hole CHs, and is connected to the source bus line SL and the first region 7s of the oxide semiconductor layer 7 in the source contact hole CHs. The drain electrode DE is disposed on the interlayer insulating layer 10 and in the second opening portion 10d, and is connected to the second region 7d of the oxide semiconductor layer 7 in the second opening portion 10d.

In the present embodiment, the lower surface of the source electrode SE is in direct contact with the oxide semiconductor layer 7. In order to reduce the contact resistance between the source electrode SE and the oxide semiconductor layer 7, a laminated film having an ohmic conductive film such as a Ti film as the lowermost layer may be used as the third conductive film.

After that, although not illustrated, the upper insulating layer 13, the lower transparent conductive layer T1 including the common electrode CE, the dielectric layer 17, and the upper transparent conductive layer T2 including the pixel electrode PE are formed as in the active matrix substrate 101 (STEPs 10 to 12). In this way, the active matrix substrate 102 illustrated in FIGS. 6A and 6B is manufactured.

In the lower source substrate structure in the related art, the source contact portion has a structure in which the oxide semiconductor layer and the source bus line are in direct contact with each other in the source opening portion formed in the lower insulating layer. Compared with such a structure in the related art, the active matrix substrate according to the present embodiment has the following effects.

With the active matrix substrates 102 and 103 according to the present embodiment, since the oxide semiconductor layer 7 and the source bus line SL are connected via the source electrode SE, it is possible to reduce the contact resistance of the source contact portion as compared with the lower source substrate in the related art.

Further, in the lower source substrate in the related art, the lower insulating layer 5 needs to be patterned before the oxide semiconductor layer 7 is formed. In contrast, in the present embodiment, since the lower insulating layer 5 and the interlayer insulating layer 10 are performed in a common etching step, the number of photomasks used can be reduced.

Further, as examined by the present inventor, in the lower source substrate in the related art, a portion of the resist layer formed on the lower insulating layer 5 may remain without being peeled off. A remaining portion of the resist layer is referred to as "resist residue". When the oxide semiconductor film is formed on the lower insulating layer 5, the adhesion between the oxide semiconductor film and the resist residue is low, so that the portion of the oxide semiconductor film located above the resist residue may be peeled off, resulting in defects in the oxide semiconductor film. In the present embodiment, since it is not necessary to form the resist layer on the lower insulating layer 5, the above problem caused by the resist residue does not occur.

Figure 9:
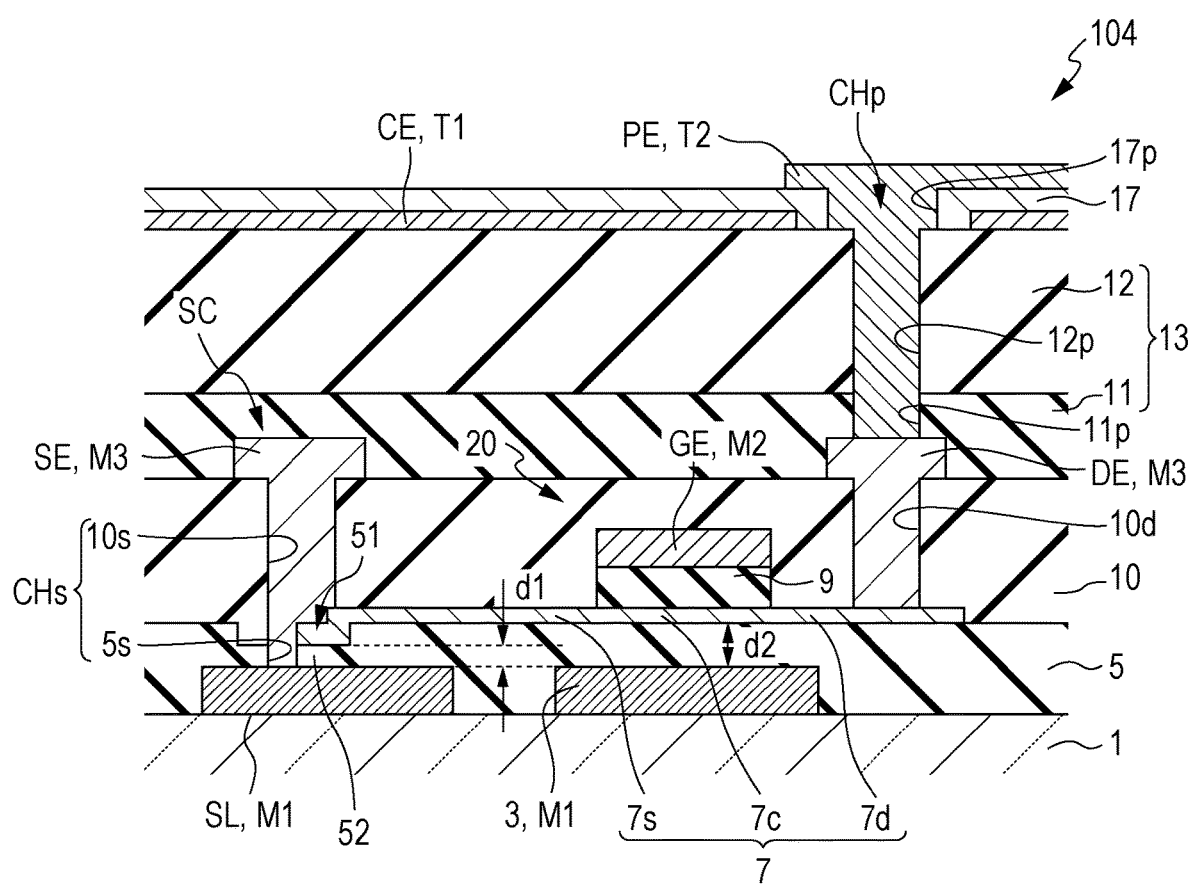
FIG. 9 is a cross-sectional view illustrating another active matrix substrate 104 according to the second embodiment.

FIG. 9 is a cross-sectional view illustrating a pixel region in still another active matrix substrate 104 according to the present embodiment. The same reference numerals are given to the same components as those in FIGS. 2A and 2B, and the description thereof will be omitted.

The active matrix substrate 104 is different from the active matrix substrates 102 and 103 in that the lower insulating layer 5 includes a thin film region 52 thinner than the other regions in the source contact portion SC. Hereinafter, the differences from the active matrix substrate 102 will be described.

In the source contact portion SC, the lower insulating layer 5 is provided with the thin film region 52. The thickness d1 of the thin film region 52 is smaller than the thickness d2 of the other region of the lower insulating layer 5 (for example, region overlapping the channel region 7c when viewed from the normal direction of the substrate 1). The thickness d1 of the thin film region 52 may be, for example, ½ or less of the thickness d2. Here, the thin film region 52 is formed by providing a recessed portion 51 having a predetermined depth on the surface of the lower insulating layer 5.

In the source contact portion SC, the oxide semiconductor layer 7 is disposed so as to partially cover the thin film region 52. The first opening portion 10s in the source contact hole CHs is disposed so as to at least partially overlap the thin film region 52. The lower opening portion 5s is formed in the thin film region 52 of the lower insulating layer 5. In this example, the lower opening portion 5s is located inside the recessed portion 51 when viewed from the normal direction of the substrate 1.

Method for Manufacturing Active Matrix Substrate 104

FIGS. 10A to 10E are step sectional views illustrating an example of a method for manufacturing an active matrix substrate 104 according to the present embodiment, and illustrate each of the TFT forming regions.

Hereinafter, a method for manufacturing one pixel region of the plurality of pixel regions in the active matrix substrate 104 will be described. Description of the material, thickness, forming process, and the like of each layer will be omitted when they are the same as those of the active matrix substrate 102.

Figure 10A:
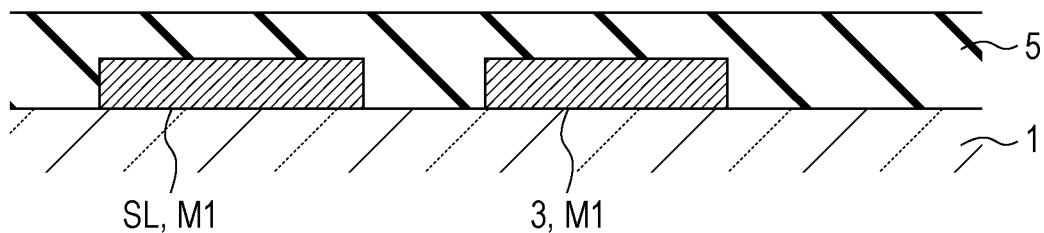
FIG. 10A is a step sectional view illustrating a method for manufacturing the active matrix substrate 104.

First, as illustrated in FIG. 10A, the first metal layer M1 including the source bus line SL and the light shielding layer 3 of the TFT is formed, and then the lower insulating layer 5 is formed so as to cover the first metal layer M1.

Figure 10B:
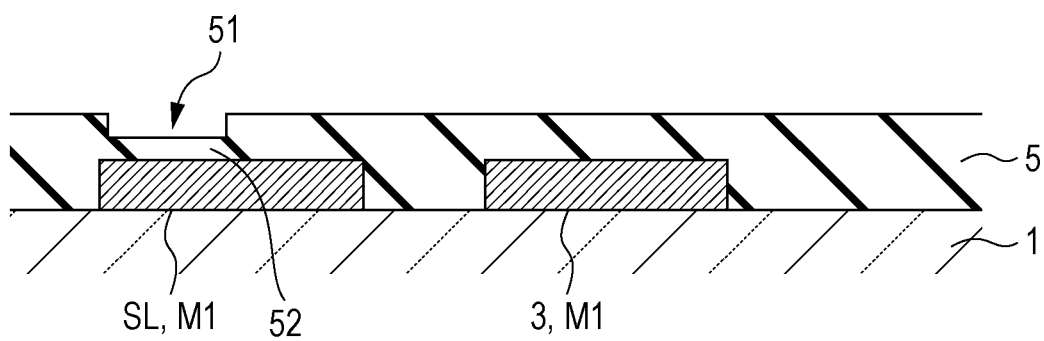
FIG. 10B is a step sectional view illustrating a method for manufacturing the active matrix substrate 104.

Thereafter, as illustrated in FIG. 10B, in each region (source contact portion forming region) where the source contact portion is to be formed, the thin film region 52 is formed in the lower insulating layer 5 by forming the recessed portion 51 on the surface of the lower insulating layer 5. For example, the recessed portion 51 can be formed by forming a resist layer on the lower insulating layer 5 in a known photolithography step and etching only the upper portion of the lower insulating layer 5 using the resist layer as a mask (half-etching).

Figure 10C:
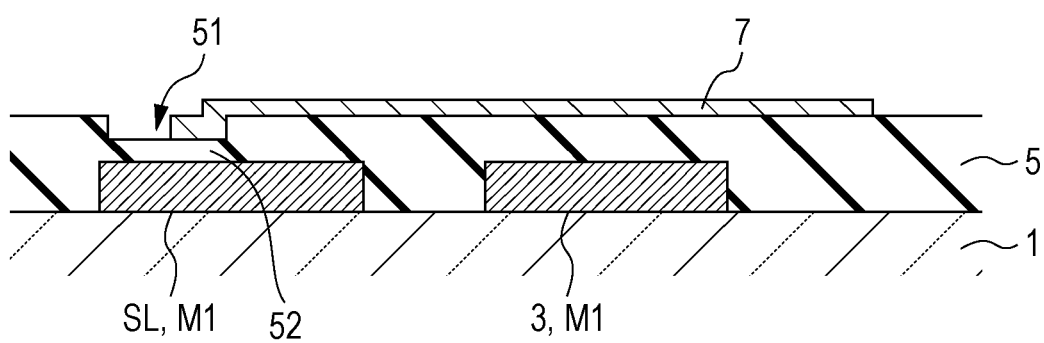
FIG. 10C is a step sectional view illustrating a method for manufacturing the active matrix substrate 104.

Subsequently, as illustrated in FIG. 10C, the oxide semiconductor layer 7 is formed on the lower insulating layer 5. Here, the oxide semiconductor layer 7 is disposed so as to cover only a portion of the recessed portion 51 (that is, only a portion of the thin film region 52).

Figure 10D:
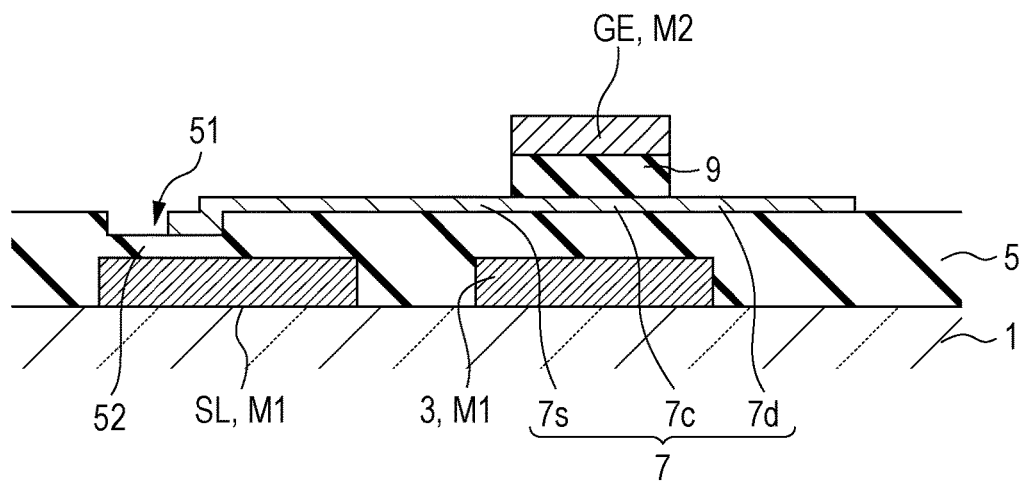
FIG. 10D is a step sectional view illustrating a method for manufacturing the active matrix substrate 104.

Next, as illustrated in FIG. 10D, the gate insulating layer 9 and the gate electrode GE are formed on a portion of the oxide semiconductor layer 7. Thereafter, the oxide semiconductor layer 7 is subjected to a resistance lowering treatment to form a channel region 7c, a first region 7s, and a second region 7d in the oxide semiconductor layer 7.

Figure 10E:
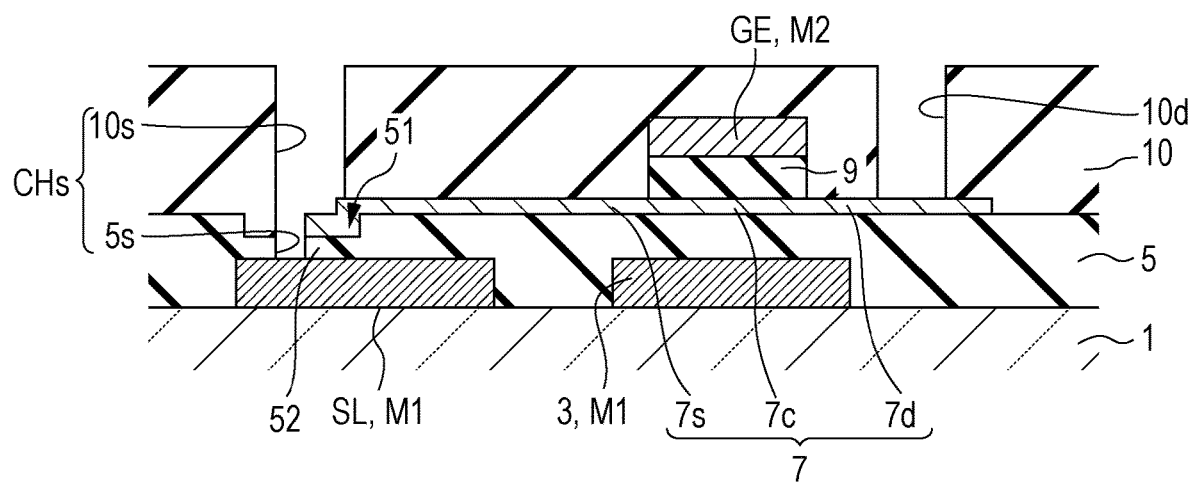
FIG. 10E is a step sectional view illustrating a method for manufacturing the active matrix substrate 104.

Next, as illustrated in FIG. 10E, an interlayer insulating layer 10 covering the oxide semiconductor layer 7, the gate insulating layer 9, and the gate electrode GE is formed, and the interlayer insulating layer 10 is patterned. As a result, the interlayer insulating layer 10 is formed with a source contact hole CHs that exposes a portion of the source bus line SL and a portion of the first region 7s of the oxide semiconductor layer 7 and a second opening portion 10d that exposes a portion of the second region 7d of the oxide semiconductor layer 7. The source contact hole CHs includes the lower opening portion 5s formed in the thin film region 52 of the lower insulating layer 5 and the first opening portion 10s formed in the interlayer insulating layer 10. The first opening portion 10s is disposed so that a portion thereof overlaps the oxide semiconductor layer 7 and a remaining portion overlaps the thin film region 52 when viewed from the normal direction of the substrate 1. As a result, only the thin film region 52 of the lower insulating layer 5 is etched to form the lower opening portion 5s. A portion of the side surface of the lower opening portion 5s is aligned with the side surface of the oxide semiconductor layer 7, and the other portion is aligned with the side surface of the first opening portion 10s.

Subsequently, although not illustrated, the source electrode SE is formed on the interlayer insulating layer 10 and in the source contact hole CHs, and the drain electrode DE is formed on the interlayer insulating layer 10 and in the second opening portion 10d. The subsequent steps are the same as those of the active matrix substrate 101, and thus the description thereof will be omitted.

In the method for manufacturing the active matrix substrate 104, the number of thinning (half-etching) steps of the lower insulating layer 5 is increased as compared with the active matrix substrate 102. However, the present embodiment has the following advantages.

In the method for manufacturing the active matrix substrate 102, in the etching step of the interlayer insulating layer 10 and the lower insulating layer 5, after the interlayer insulating layer 10 is etched to expose a portion of the oxide semiconductor layer 7, the exposed portion of the oxide semiconductor layer 7 is exposed to the etching gas until the etching of the lower insulating layer 5 is completed, which may cause damage. During the etching of the lower insulating layer 5, the edge of the resist layer may recede due to the etching gas, and the size of the contact hole may be larger than a predetermined size. In contrast, according to the present embodiment, since the lower insulating layer 5 in the region forming the source contact hole CHs is thinned, the etching time of the lower insulating layer 5 is shortened. As a result, damage to the oxide semiconductor layer 7 and the wiring exposed by etching of the interlayer insulating layer 10 can be suppressed, and the shift amount in the size of the contact hole can be reduced.

When a through hole reaching the source bus line SL is formed in the lower insulating layer 5 before the oxide semiconductor layer 7 is formed, the exposed portion of the source bus line SL may be damaged by the etching solution of the oxide semiconductor film. In contrast, in the present embodiment, only the lower insulating layer 5 is thinned before the oxide semiconductor layer 7 is formed, and the source bus line SL is not exposed. Therefore, damage to the source bus line SL due to the etching solution of the oxide semiconductor film can be avoided.

In this example, the thinner the thin film region 52, the shorter the time required for etching the lower insulating layer 5 in the etching step of forming the source contact hole CHs, so that damage to the exposed portion of the oxide semiconductor layer 7 and shift in the size of the contact hole can be more effectively. From this point of view, the thickness d1 of the thin film region 52 may be, for example, ½ or less, and preferably ⅓ or less of the thickness d2 of the other region of the lower insulating layer 5 (for example, the thickness of the portion overlapping the channel region 7c). The lower limit of the thickness d1 of the thin film region 52 is not particularly limited as long as the source bus line SL is not exposed, and is set to, for example, 100 nm or more (30% or more of the thickness d2) in consideration of etching accuracy and the like.

Although not illustrated, the oxide semiconductor layer 7 may be provided with an opening portion 71 or a notched portion, as in the active matrix substrate 103. When viewed from the normal direction of the substrate 1, the opening portion 71 may be located inside the thin film region 52 (inside the recessed portion 51).

The disposition of the source contact portion SC in the present embodiment may be applied to other lower source substrates, such as various lower source substrates disclosed in U.S. patent application Ser. No. 17/156,769 by the present inventor. For reference, the entire disclosure of the above US Provisional application is incorporated herein.

Third Embodiment

The active matrix substrate according to a third embodiment is different from the above-described embodiment in that, in the pixel contact portion PC, the second opening portion 10d formed in the interlayer insulating layer 10 is disposed in the region H located between the two gate bus lines GL.

The active matrix substrate according to the present embodiment may have an upper source substrate structure in which a source bus line is provided between the gate bus line and the substrate, and may have an upper source substrate structure in which the gate bus line is provided between the source bus line and the substrate. Here, a structure of the active matrix substrate according to the present embodiment will be described by taking the active matrix substrate having the upper source substrate structure as an example.

Figure 11A:
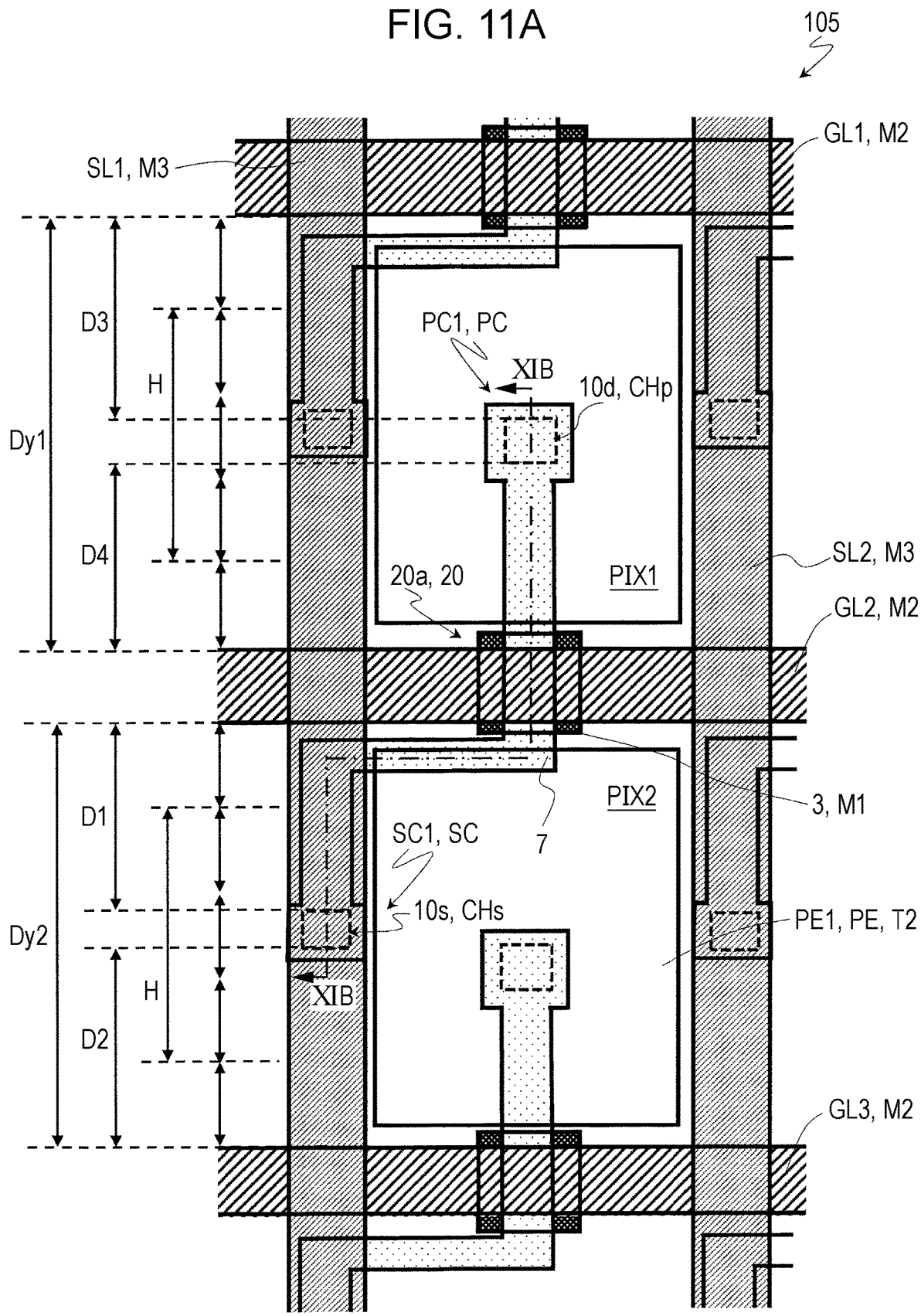
FIG. 11A is a plan view illustrating a pixel region in an active matrix substrate 105 according to a third embodiment.
Figure 11B:
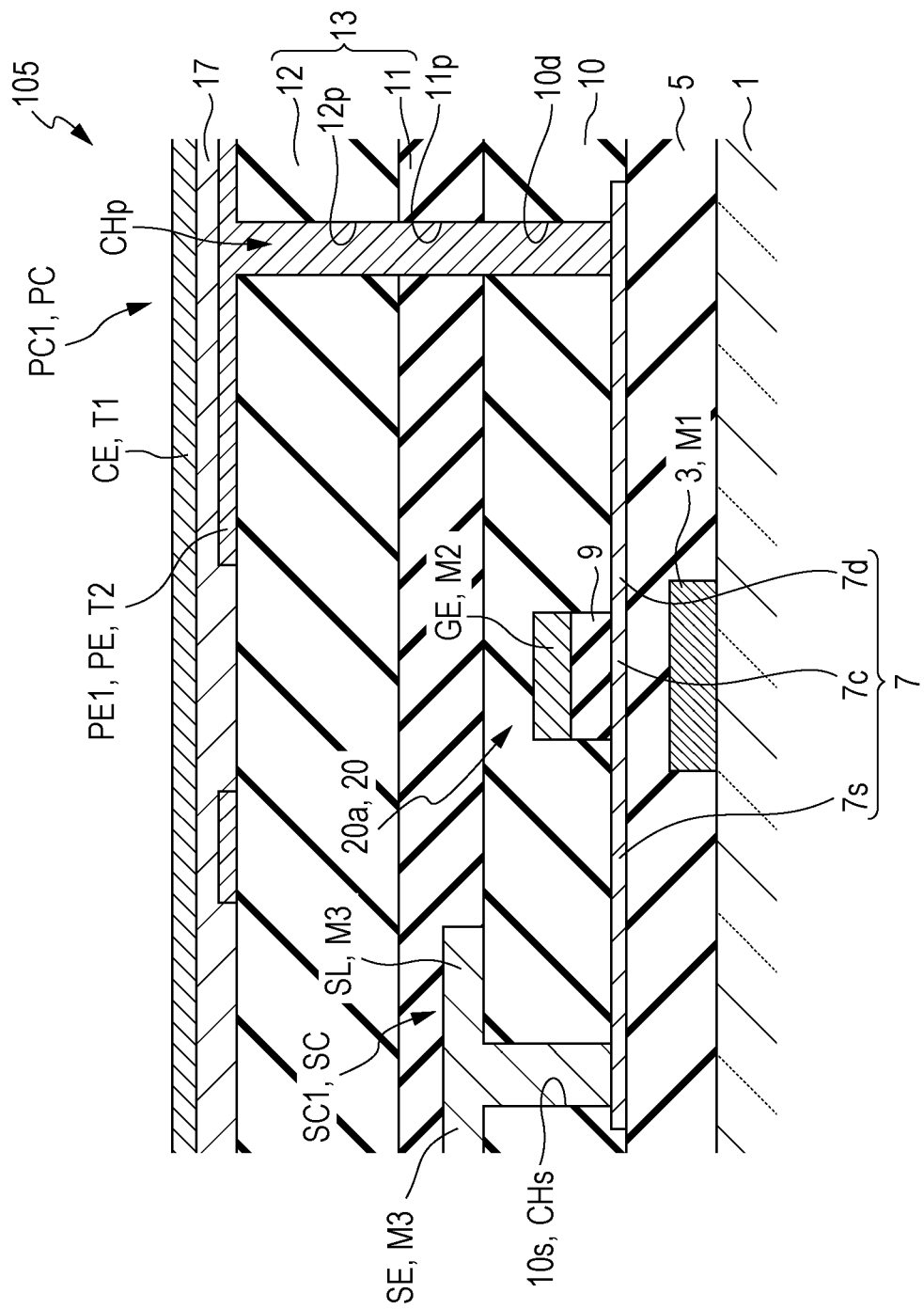
FIG. 11B is a cross-sectional view of the active matrix substrate 105 taken along the line XIB-XIB illustrated in FIG. 11A.

FIG. 11A is a plan view illustrating a pixel region in an active matrix substrate 105 according to a fourth embodiment, and FIG. 11B is a cross-sectional view taken along the line XIB-XIB across the TFT 20 of the pixel region. The same reference numerals are given to the same components as those in FIGS. 2A and 2B, and the description thereof will be omitted.

In the active matrix substrate 105, each TFT 20 does not have the drain electrode DE formed on the third metal layer M3. Further, each pixel electrode PE is formed on the lower transparent conductive layer T1, and a common electrode (not illustrated) is formed on the upper transparent conductive layer T2. That is, the pixel electrode PE is located closer to the substrate 1 than the common electrode. Although not illustrated, the common electrode is provided with a slit or notched portion for each pixel region PIX.

The pixel contact portion PC has the pixel contact hole CHp formed in the upper insulating layer 13 and the interlayer insulating layer 10 and exposing a portion of the second region 7d of the TFT 20. The pixel contact hole CHp includes the second opening portion 10d formed in the interlayer insulating layer 10 and the opening portion 13p formed in the upper insulating layer 13. The pixel electrode PE is electrically connected to the second region 7d of the corresponding TFT 20 within the pixel contact hole CHp. The pixel electrode PE may be in direct contact with the second region 7d.

In the present embodiment, the second opening portion 10d constituting the pixel contact hole CHp is disposed in the region H located between the two gate bus lines. Hereinafter, more detailed description will be given by taking the first TFT 20a and the first pixel contact portion PC1 associated with the first pixel region PIX1 as an example.

In the first pixel contact portion PC1 connecting the first TFT 20a and the first pixel electrode PE1, the second opening portion 10d is located between the first gate bus line GL1 and the second gate bus line GL2 in the first pixel region PIX1 when viewed from the normal direction of the substrate 1, and a third distance D3 in the column direction between the first gate bus line GL1 and the second opening portion 10d and a fourth distance D4 in the column direction between the second gate bus line GL2 and the second opening portion 10d are both ⅕ or more of the first interval Dy1 in the column direction between the first gate bus line GL1 and the second gate bus line GL2.

The second region 7d of the first TFT 20a extends to the region H located between the first gate bus line GL1 and the second gate bus line GL2 in the first pixel region PIX1, and is electrically connected to the pixel electrode PE in the pixel contact hole CHp.

In the active matrix substrate in the related art, when a remarkable pattern thickening occurs in the gate bus line GL, there is a possibility that the portion g1 in which the line width of the gate bus line GL is expanded reaches the pixel contact portion PC.

In contrast, according to the present embodiment, the second opening portion 10d of the pixel contact hole CHp is disposed sufficiently away from the gate bus line GL. Therefore, for example, even if the width of the first gate bus line GL1 or the second gate bus line GL2 becomes irregular or the pattern thickening occurs due to foreign matter, leakage between the pixel electrode and the gate due to contact between the first gate bus line GL1 or the second gate bus line GL2 and the pixel electrode PE (drain electrode if a drain electrode is provided) in the second opening portion 10d can be suppressed.

Further, in the active matrix substrate 105, the TFT 20 does not have the drain electrode DE. As a result, the pixel contact portion PC can be constituted only by the transparent member, and thus the pixel contact portion PC can be disposed in the light transmitting region of the corresponding pixel region PIX while suppressing a decrease in the pixel aperture ratio.

The TFT 20 may have the drain electrode DE in the third metal layer M3 (see FIG. 2B). In this case, at least the second opening portion 10d formed in the interlayer insulating layer 10 just needs to be disposed in the region H in the corresponding pixel region PIX, and the pixel contact hole CHp may be disposed outside or inside the region H. However, as illustrated in FIG. 2B, when the second opening portion 10d and the pixel contact hole CHp are at least partially overlapped when viewed from the normal direction of the substrate 1, the area required for the pixel contact portion PC can be reduced.

The structure of the active matrix substrate according to the present embodiment is not limited to the structure illustrated in the figure. For example, the pixel electrode PE may be disposed in the upper transparent conductive layer T2. The upper insulating layer 13 does not have to include the organic insulating layer 12. In this way, the depth of the source contact hole CHs can be reduced. Furthermore, the upper source substrate structure has been described above as an example; however, in the lower source substrate structure (for example, FIG. 6A, FIG. 6B, FIG. 7A, FIG. 7B, or the like), the same effect can be obtained by disposing the second opening portion 10d in the region H of the corresponding pixel region PIX.

Modification Example

In the active matrix substrate of the first to third embodiments described above, the area of the first region 7s of the oxide semiconductor layer 7 It may be disposed such that the area of the portion overlapping the source bus line SL becomes small when viewed from the normal direction of the substrate 1. Accordingly, the coupling capacitance between the first region 7s of the oxide semiconductor layer 7 and the source bus line SL can be reduced.

When the area of the first region 7s overlapping the source bus line SL is reduced, the area of the portion of the first region 7s that is located in the light transmitting region (region that contributes to display) of the pixel region PIX increases. However, since the oxide semiconductor layer 7 has transparency to visible light, the pixel aperture ratio can be maintained even if the area of the portion located in the light transmitting region increases.

Hereinafter, a structure of the active matrix substrate of a modification example will be described by taking the active matrix substrate of the upper source substrate structure as an example. Active matrix substrates of the following first and second modification examples are different from that of the active matrix substrate 101 in the planar shape of the oxide semiconductor layer 7.

Figure 12:
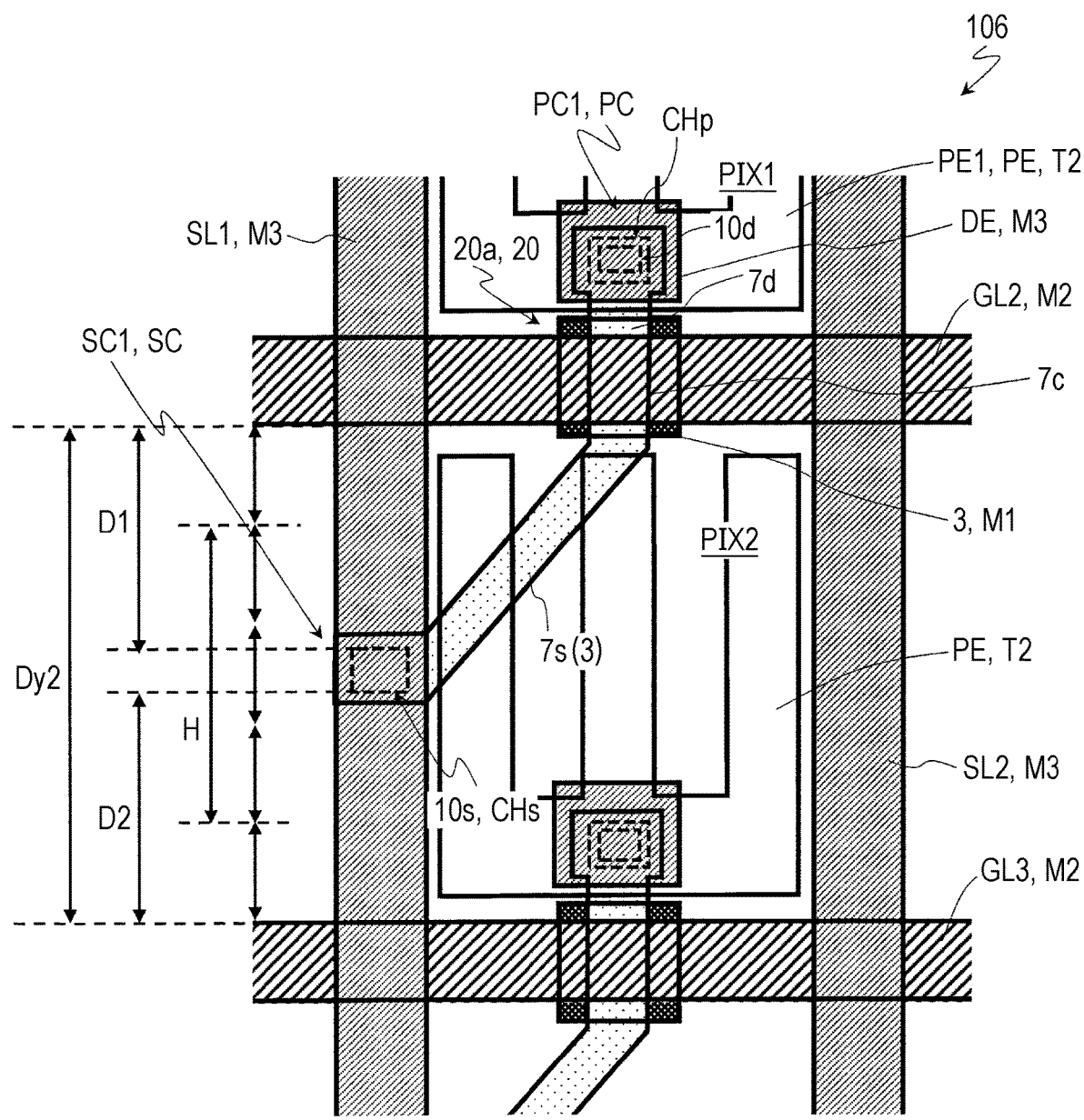
FIG. 12 is a plan view illustrating a pixel region of an active matrix substrate 106 according to a first modification example.

FIG. 12 is a plan view illustrating a pixel region of an active matrix substrate 106 according to a first modification example. The same reference numerals are given to the same components as those in FIGS. 2A and 2B, and the description thereof will be omitted.

In the active matrix substrate 106, the first region 7s of the oxide semiconductor layer 7 in the first TFT 20a includes a portion 7s(3) extending in the direction intersecting the row direction and the column direction in the second pixel region PIX2. The portion 7s(3) does not overlap the first source bus line SL1 when viewed from the normal direction of substrate 1.

In the first modification example, the area of the region where the first region 7s of the oxide semiconductor layer 7 and the first source bus line SL1 overlap each other when viewed from the normal direction of the substrate 1 can be reduced as compared with the active matrix substrate 101. Accordingly, the coupling capacitance between the first region 7s of the oxide semiconductor layer 7 and the first source bus line SL1 can be reduced. The length of the portion of the first region 7s of the first TFT 20a that overlaps the first source bus line SL1 when viewed from the normal direction of the substrate 1 may be, for example, ⅕ or less of the interval Dy2.

The portion 7s(3) of the first region 7s may extend obliquely from the channel region 7c toward the source contact portion SC. Accordingly, the length of the first region 7s in the channel length direction can be reduced.

Figure 13:
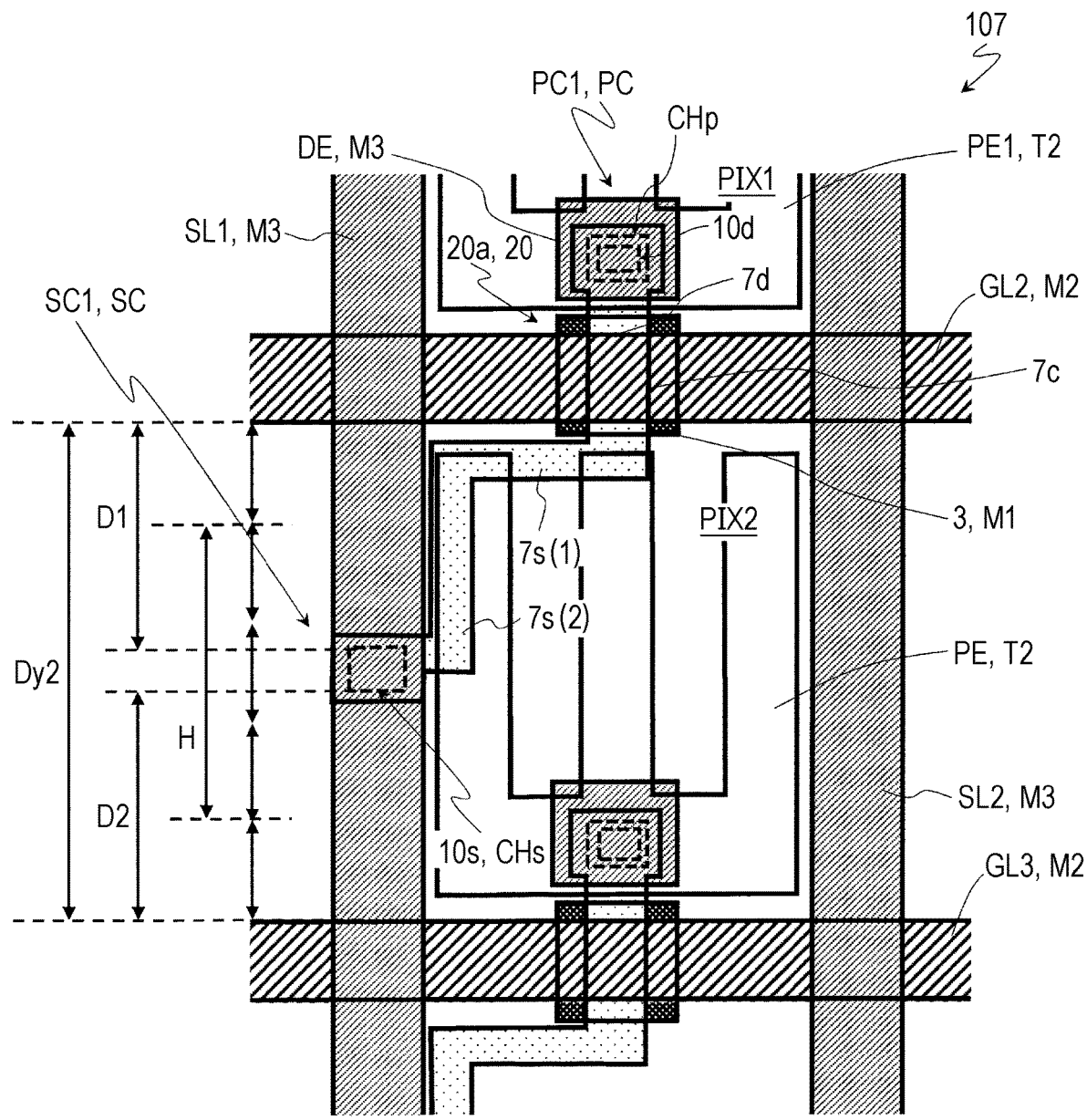
FIG. 13 is a plan view illustrating a pixel region of an active matrix substrate 107 according to a second modification example.

FIG. 13 is a plan view illustrating a pixel region of an active matrix substrate 107 according to a second modification example. The same reference numerals are given to the same components as those in FIGS. 2A and 2B, and the description thereof will be omitted.

In the active matrix substrate 107, the first region 7s of the oxide semiconductor layer 7 in the first TFT 20a includes a first portion 7s(1) extending in the row direction and a second portion 7s(2) extending in the column direction in the second pixel region PIX2. When viewed from the normal direction of substrate 1, none of the first portion 7s(1) and the second portion 7s(2) overlaps the first source bus line SL1.

In the second modification example, since the second portion 7s(2) does not overlap the first source bus line SL1 when viewed from the normal direction of the substrate 1, the coupling capacitance between the first region 7s of the oxide semiconductor layer 7 and the first source bus line SL1 can be reduced as compared with the active matrix substrate 101. The length of the portion of the first region 7s of the first TFT 20a that overlaps the first source bus line SL1 when viewed from the normal direction of the substrate 1 may be, for example, ⅕ or less of the interval Dy2.

When viewed from the normal direction of the substrate 1, the first portion 7s(1) of the oxide semiconductor layer 7 may be disposed in a region close to the second gate bus line GL2, and the second portion 7s(2) thereof may be disposed in a region close to the first source bus line SL1. Accordingly, since the pattern of the oxide semiconductor layer 7 can be disposed inconspicuously as compared with the first modification example, the influence on the display performance caused by forming the oxide semiconductor layer 7 in the light transmitting region can be suppressed.

In the above description, the active matrix substrate having the upper source substrate structure has been described as an example; however, the shape and disposition of the first region 7s of the oxide semiconductor layer 7 of the first and second modification examples can be applied to active matrix substrates (active matrix substrate of the lower source substrate structure, active matrix substrate with the pixel contact portion disposed in the region H) according to other embodiments.

The structure and the method for manufacturing the active matrix substrate of the present embodiment according to the present disclosure are not limited to the structure and the method exemplified above. In the above description, the active matrix substrate provided with a top gate type pixel TFT is exemplified. Instead, a double gate type pixel TFT having two gates with an oxide semiconductor layer interposed therebetween may be used. For example, in the TFT 20 in the above embodiment, the light shielding layer 3 may function as the lower gate electrode.

Embodiments of the present disclosure can be widely applied to devices and electronic devices provided with the TFT. For example, the embodiments can be applied to a circuit substrate such as an active matrix substrate, a liquid crystal display device, an organic EL display device, a display device such as a micro LED display device, an image capturing apparatus such as a radiation detector and an image sensor, and an electronic device such as an image input device and a fingerprint reading device.

About Oxide Semiconductor

The oxide semiconductor included in the oxide semiconductor layer of each TFT in the present embodiment may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c axis is oriented substantially perpendicular to the layer surface.

The oxide semiconductor layer may have a laminated structure of two or more layers. In a case where the oxide semiconductor layer has a laminated structure, the oxide semiconductor layer may include an amorphous oxide semiconductor layer and a crystalline oxide semiconductor layer. Alternatively, a plurality of crystalline oxide semiconductor layers having different crystal structures may be included. A plurality of amorphous oxide semiconductor layers may be included. In a case where the oxide semiconductor layer has a two-layer structure including an upper layer and a lower layer, an energy gap of the oxide semiconductor included in the layer (the lower layer in the case of the bottom gate structure and the upper layer in the case of the top gate structure) located on the gate electrode side of the two layers may be smaller than an energy gap of the oxide semiconductor included in the layer (the upper layer in the case of the bottom gate structure and the lower layer in the case of the top gate structure) located on the side opposite to the gate electrode. Here, in a case where the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film formation methods, configurations of oxide semiconductor layers having a laminated structure, and the like of the amorphous oxide semiconductor and the above crystalline oxide semiconductors are described in, for example, Japanese Unexamined Patent Application Publication No. 2014-007399. For reference, the entire disclosure of Japanese Unexamined Patent Application Publication No. 2014-007399 is incorporated herein.

The oxide semiconductor layer may include, for example, at least one metal element of In, Ga, and Zn. In the present embodiment, the oxide semiconductor layer includes, for example, an In—Ga—Zn—C-based semiconductor (for example, indium gallium zinc oxide). Here, the In—Ga—Zn—C-based semiconductor is a ternary oxide of indium (In), gallium (Ga), and zinc (Zn), the ratio (composition ratio) of In to Ga to Zn is not particularly limited and includes, for example, In:Ga:Zn=2:2:1, In:Ga:Zn=1:1:1, In:Ga:Zn=1:1:2, and the like. Such an oxide semiconductor layer can be formed from an oxide semiconductor film including an In—Ga—Zn—C-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c axis is oriented substantially perpendicular to the layer surface is preferable.

The crystalline structure of the crystalline In—Ga—Zn—C-based semiconductor is disclosed, for example, in the above-mentioned Japanese Unexamined Patent Application Publication No. 2014-007399, Japanese Unexamined Patent Application Publication No. 2012-134475, Japanese Unexamined Patent Application Publication No. 2014-209727, and the like. For reference, the entire disclosures of Japanese Unexamined Patent Application Publication No. 2012-134475 and Japanese Unexamined Patent Application Publication No. 2014-209727 are incorporated herein. A TFT having an In—Ga—Zn—O-based semiconductor layer has high mobility (more than 20 times compared to an a-Si TFT) and low leakage current (less than 1/100 compared to an a-Si TFT). Therefore, it is suitably used as a driving TFT (for example, a TFT included in a driving circuit provided on the same substrate as a display region around the display region including a plurality of pixels) and a pixel TFT (TFT provided in a pixel).

The oxide semiconductor layer may include another oxide semiconductor instead of the In—Ga—Zn—O-based semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, and the like.

The present disclosure contains subject matter related to that disclosed in U.S. Provisional Patent Application No. 63/013,194 filed in the U.S. Patent Office on Apr. 21, 2020, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate that includes a plurality of pixel regions disposed in a matrix in a row direction and a column direction, the active matrix substrate comprising:
   a substrate;
   a plurality of gate bus lines supported on a main surface of the substrate and extending in the row direction;
   a plurality of source bus lines supported on the main surface of the substrate and extending in the column direction;
   an interlayer insulating layer that covers the plurality of gate bus lines;
   a plurality of oxide semiconductor TFTs disposed in association with the plurality of pixel regions; and
   a plurality of pixel electrodes disposed in each of the plurality of pixel regions, wherein the plurality of gate bus lines include a first gate bus line, a second gate bus line, and a third gate bus line disposed adjacent to each other in this order, and the plurality of source bus lines include a first source bus line and a second source bus line disposed adjacent to each other, the plurality of pixel regions include a first pixel region defined by the first gate bus line, the second gate bus line, the first source bus line, and the second source bus line, and a second pixel region defined by the second gate bus line, the third gate bus line, the first source bus line, and the second source bus line, the plurality of oxide semiconductor TFTs include a first TFT associated with the first pixel region, the first TFT including:

an oxide semiconductor layer including a channel region, and a first region and a second region located on both sides of the channel region, respectively, at least a portion of the first region being located in the second pixel region, at least a portion of the second region being located in the first pixel region;

a gate electrode disposed on the channel region of the oxide semiconductor layer via a gate insulating layer, the gate electrode being connected to the second gate bus line or being a portion of the second gate bus line; and a source electrode disposed on the interlayer insulating layer, the active matrix substrate further comprises:

a first pixel contact portion that electrically connects the second region in the first TFT to a first pixel electrode disposed in the first pixel region of the plurality of pixel electrodes; and a first source contact portion that electrically connects the first region in the first TFT to the first source bus line via the source electrode, in the first source contact portion, the interlayer insulating layer has a first opening portion that exposes a portion of the first region, and the source electrode is electrically connected to the first region within the first opening portion, and when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both $\frac{1}{5}$ or more of a second interval Dy2 in the column direction between the second gate bus line and the third gate bus line.

2. The active matrix substrate according to claim 1, wherein, when viewed from the normal direction of the substrate, the first opening portion at least partially overlaps the first source bus line.

3. The active matrix substrate according to claim 1, wherein the first region of the first TFT includes a first portion extending in the row direction in the second pixel region, and a second portion extending in the column direction so as to overlap the first source bus line when viewed from the normal direction of the substrate.

4. The active matrix substrate according to claim 1, wherein
the first region of the first TFT includes a first portion extending in the row direction and a second portion extending in the column direction in the second pixel region, and when viewed from the normal direction of the substrate, the first portion and the second portion do not overlap the first source bus line.

5. The active matrix substrate according to claim 1, wherein
the first region of the first TFT includes a portion extending in a direction intersecting the row direction and the column direction in the second pixel region, and
when viewed from the normal direction of the substrate, the portion does not overlap the first source bus line.

6. The active matrix substrate according to claim 1, wherein a length of a portion of the first region of the first TFT that overlaps the first source bus line when viewed from the normal direction of the substrate is $\frac{1}{5}$ or less of the second interval Dy2.

7. The active matrix substrate according to claim 1, wherein
the first pixel contact portion includes a second opening portion formed in the interlayer insulating layer, and
when viewed from the normal direction of the substrate, the second opening portion is located between the first gate bus line and the second gate bus line in the first pixel region, and a third distance D3 in the column direction between the first gate bus line and the second opening portion and a fourth distance D4 in the column direction between the second gate bus line and the second opening portion are both $\frac{1}{5}$ or more of a first interval Dy1 in the column direction between the first gate bus line and the second gate bus line.

8. The active matrix substrate according to claim 1, wherein
the first source bus line is disposed on the interlayer insulating layer, and
the source electrode of the first TFT is connected to the first source bus line or is a portion of the first source bus line.

9. The active matrix substrate according to claim 1, wherein
the first source bus line is disposed on the substrate side of the oxide semiconductor layer via a lower insulating layer,
the lower insulating layer has a lower opening portion that exposes a portion of the first source bus line, and the lower opening portion at least partially overlaps the first opening portion, and
the source electrode of the first TFT is electrically connected to the first region of the oxide semiconductor layer and the first source bus line in a first source contact hole including the first opening portion and the lower opening portion.

10. The active matrix substrate according to claim 1, wherein the first distance D1 and the second distance D2 are both $\frac{2}{5}$ or more of the second interval Dy2.

11. The active matrix substrate according to claim 1, wherein the oxide semiconductor layer includes an In—Ga—Zn—O-based semiconductor.

12. The active matrix substrate according to claim 11, wherein the In—Ga—Zn—O-based semiconductor includes a crystalline portion.

13. A method for manufacturing an active matrix substrate that includes a plurality of pixel regions, a plurality of source bus lines extending in a column direction and including a first source bus line and a second source bus line disposed adjacent to each other, a plurality of gate bus lines extending in a row direction and including a first gate bus line, a second gate bus line, and a third gate bus line disposed adjacent to each other in this order, and a plurality of oxide semiconductor TFTs associated with the plurality of pixel regions,
  the plurality of pixel regions including a first pixel region defined by the first gate bus line, the second gate bus line, the first source bus line, and the second source bus line, and a second pixel region defined by the second gate bus line, the third gate bus line, the first source bus line, and the second source bus line,
  the plurality of oxide semiconductor TFTs including a first TFT associated with the first pixel region, the method comprising: in a first TFT forming region where the first TFT is formed,
  (a) forming an oxide semiconductor layer of the first TFT on a substrate;
  (b) forming a gate insulating layer from a gate insulating film and integrally forming a gate electrode of the first TFT and the second gate bus line from a gate conductive film by forming the gate insulating film and the gate conductive film so as to cover the oxide semiconductor layer, and patterning the gate insulating film and the gate conductive film;
  (c) forming an interlayer insulating layer covering the gate electrode and the second gate bus line;
  (d) forming a first opening portion that exposes a portion of the oxide semiconductor layer of the first TFT in the interlayer insulating layer; and
  (e) integrally forming a source electrode of the first TFT and the first source bus line by forming a source conductive film on the interlayer insulating layer and in the first opening portion, and patterning the source conductive film, the source electrode being in contact with the portion of the oxide semiconductor layer in the first opening portion,
  wherein, when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both $1/5$ or more of a second interval Dy2 in the column direction between the second gate bus line and the third gate bus line.

14. A method for manufacturing an active matrix substrate that includes a plurality of pixel regions, a plurality of source bus lines extending in a column direction and including a first source bus line and a second source bus line disposed adjacent to each other, a plurality of gate bus lines extending in a row direction and including a first gate bus line, a second gate bus line, and a third gate bus line disposed adjacent to each other in this order, and a plurality of oxide semiconductor TFTs associated with the plurality of pixel regions,
  the plurality of pixel regions including a first pixel region defined by the first gate bus line, the second gate bus line, the first source bus line, and the second source bus line, and a second pixel region defined by the second gate bus line, the third gate bus line, the first source bus line, and the second source bus line,
  the plurality of oxide semiconductor TFTs including a first TFT associated with the first pixel region, the method comprising: in a first TFT forming region where the first TFT is formed,
  (a) forming the first source bus line by forming a lower conductive film on a substrate and patterning the lower conductive film;
  (b) forming a lower insulating layer covering the first source bus line;
  (c) forming an oxide semiconductor layer of the first TFT on the lower insulating layer;
  (d) forming a gate insulating layer from a gate insulating film and integrally forming a gate electrode of the first TFT and the second gate bus line from a gate conductive film by forming the gate insulating film and the gate conductive film so as to cover the oxide semiconductor layer, and patterning the gate insulating film and the gate conductive film;
  (e) forming an interlayer insulating layer covering the gate electrode and the second gate bus line;
  (f) forming a first source contact hole that exposes a portion of the first source bus line of the first TFT and a portion of the oxide semiconductor layer by patterning the interlayer insulating layer and the lower insulating layer, the first source contact hole including a first opening portion formed in the interlayer insulating layer and a lower opening portion formed in the lower insulating layer; and
  (g) forming a source electrode in contact with the portion of the first source bus line and the portion of the oxide semiconductor layer in the first source contact hole by forming a source conductive film on the interlayer insulating layer and in the first source contact hole, and patterning the source conductive film,
  wherein, when viewed from a normal direction of the substrate, the first opening portion is located between the second gate bus line and the third gate bus line, and a first distance D1 in the column direction between the second gate bus line and the first opening portion and a second distance D2 in the column direction between the third gate bus line and the first opening portion are both $1/5$ or more of a second interval Dy2 in the column direction between the second gate bus line and the third gate bus line.

* * * * *